United States Patent
Ho et al.

(10) Patent No.: US 6,689,486 B2
(45) Date of Patent: Feb. 10, 2004

(54) BIMORPHIC, COMPOSITIONALLY-GRADED, SPUTTER-DEPOSITED, THIN FILM SHAPE MEMORY DEVICE

(76) Inventors: Ken K. Ho, 2719 Manitou Ave., Los Angeles, CA (US) 90031; Gregory P. Carman, 3254 Colby Ave., Los Angeles, CA (US) 90066; Peter A. Jardine, 1731 Hendrix Ave., Thousand Oaks, CA (US) 91360

( * ) Notice: Subject to any disclaimer, the term of this patent is extended or adjusted under 35 U.S.C. 154(b) by 0 days.

(21) Appl. No.: 10/282,276

(22) Filed: Oct. 28, 2002

(65) Prior Publication Data

US 2003/0162048 A1 Aug. 28, 2003

Related U.S. Application Data

(63) Continuation of application No. 09/795,555, filed on Feb. 28, 2001, now abandoned.
(60) Provisional application No. 60/185,841, filed on Feb. 29, 2000.

(51) Int. Cl.[7] ............................. C22C 1/00; C23C 14/34
(52) U.S. Cl. .................. 428/610; 148/402; 204/192.15; 204/298.09; 204/298.13
(58) Field of Search ................. 428/610; 148/402; 204/192.15, 298.12, 298.13, 298.09

(56) References Cited

U.S. PATENT DOCUMENTS

| | | | |
|---|---|---|---|
| 4,864,824 A | | 9/1989 | Gabriel et al. ................ 60/527 |
| 5,061,914 A | | 10/1991 | Busch et al. ................ 337/140 |
| 5,080,455 A | * | 1/1992 | King et al. ............ 204/192.11 |
| 5,325,880 A | | 7/1994 | Johnson et al. ................ 137/1 |
| 5,836,066 A | * | 11/1998 | Ingram ....................... 148/563 |
| 6,001,195 A | * | 12/1999 | Kajiwara et al. ........... 148/402 |
| 6,358,380 B1 | * | 3/2002 | Mann et al. ............. 204/192.2 |

FOREIGN PATENT DOCUMENTS

| | | | |
|---|---|---|---|
| JP | 59-116342 | * | 7/1984 |
| JP | 60-837753 | * | 5/1985 |
| JP | 63-166940 | * | 7/1988 |

OTHER PUBLICATIONS

J.A. Walker, et al., "Thin–film Processing of TiNi Shape Memory Alloy", Sensors and Actuators, vols. A21–A23, p. 243–246, 1990. (No Month).

J.D. Busch, et. al., "Shape–memory properties in Ni–Ti sputter deposited film", J. Appl. Phy., vol. 68 (12), pp. 6224–6228, Dec. 15, 1990.

K. Kuribayashi, et al., "Micron sized arm using reversible TiNi alloy tin film actuators". Mat. Res. Soc. Symp. Proc., vol. 276, pp. 167–175, 1992. (No Month).

J.D. Busch, et al., "Phase transformations in sputtered Ni–Ti film: effects of heat treatment and precipitates", Mat. Res. Soc. Symp. Proc., vol. 230, pp. 91–97, 1992. (No Month).

D.S. Grummon, et al., "Thermotractive titanium–nickel thin films for microelectromechanical systems and active composites", Mat. Res. Soc. Symp. Proc., vol. 459, pp. 331–342, 1997. (No Month).

(List continued on next page.)

Primary Examiner—John J. Zimmerman
(74) Attorney, Agent, or Firm—Ostrolenk, Faber, Gerb & Soffen, LLP

(57) ABSTRACT

The present invention discloses devices and a method of fabrication of devices using a shape memory effect, thin film with a compositional gradient through the thickness of the film. Specifically, a NiTi SME thin film is disclosed that can be used in actuators, MEMS devices and flow control. The process of fabrication includes a gradual heating of the target over time during the sputter deposition of a thin film on a substrate under high vacuum, without compositional modification. The resulting thin film exhibits two-way shape memory effect that can be cyclically applied without an external bias force.

13 Claims, 19 Drawing Sheets

OTHER PUBLICATIONS

Q. Su, et al., "Martensitic transformation in $Ni_{50}Ti_{50}$ films", J. of Alloys and Compound, vol. 211/212, pp. 460–463, 1994. (No Month).

S. Miyazaki, et al., "Shape memory characteristics of sputter–deposited Ti–Ni base thin films", SPIE, vol. 2441, pp. 156–164, 1995. (No Month).

A. Ishida, et al., "Shape memory behavior of Ti–Ni thin films annealed at various tempertures", Mat. Res. Soc. Symp. Proc., vol. 360, pp. 381–386, 1995. (No Month).

C.A. Ray, et al., "A Silicon–based shape memory alloy microvalve", Mat. Res. Soc. Symp. Proc., vol. 276, pp. 161–166 (1992). (No Month).

W.L. Bernard, et al., "Thin film shape memory alloy actuated micropumps", J. of Microelectromechanical Systems, vol. 7, No. 2, pp. 245–251, Jun. 1998.

K. Kuribayashi, et al., "Trial fabrication of micron sized arm using reversible TiNi alloy thin film actuators", Proceedings of the 1993 IEEE/RSJ International Conf. On Intel. Robots and Sys., Yokohama, Japan, pp. 1697–1702, Jul. 26–30, 1993.

S. Miyazaki, et al., "Effect of heat treatment on deformation behavior associated with R–phase and martensitic transformations in Ti–Ni thin films", Trans. Mat. Res. Soc. Jpn., vol. 18B, pp. 1041–1044, 1994. (No Month).

A. Ishida, et al., "Effect of heat treatment on shape memory behavior of Ti–rich Ti–Ni thin films", Materials Transactions, JIM, vol. 36, No. 11, pp. 1349–1355, 1995. (Nov).

A. Peter Jardine, "Deposition parameters for sputter–deposited thin film TiNi", Mat Res. Soc. Symp. Proc., vol. 360, pp. 293–298, 1995. (No Month).

T.W. Duerig, et al., Engineering Aspects of Shape Memory Alloys, pp. 3–46, 1990 (No Month).

S. Miyazaki, et al., "Development of perfect shape memory effect in sputter–deposited Ti–Ni thin films", Proceedings IEEE Micro Electro Mechancial Systems, pp. 176–181, 1994. (No Month).

R.H. Wolf, et al., "TiNi (Shape Memory) Films on Silicon for MEMS Applications". J. of Microelectromechanical Systems, vol. 4, No. 4, pp. 206–212, Dec. 1995.

A. Gyobu, et al., "Martensitic transformations in sputter–deposited shape memory Ti–Ni films", Mat. Trans. JIM, vol. 37, No. 4, pp. 697–702, Apr. 1996.

P. Krulevitch, et al., "Thin film shape memory alloy microactuators", J. of Microelectromechanical Systems, vol. 5, No. 4, pp. 270–282, Dec. 1996.

J. Favalukis, et al., "An Experimentally Validated Thermal Model of Thin Film NiTi", Proceedings of SPIE, vol. 3668, Part Two, pp. 617–629, Mar. 1–4, 1999.

C.M. Ho, et al., "Mems: Science and Technology," Application of Microfabrication to Fluid Mechanics, FED V. 197, ASME 1994, pp. 39–49, 1994. (No Month).

L. G. Carpenter: Vacuum Technology An Introduction, Adam Hilger Ltd., Bristol 2nd Edition, (1983), pp. 76–82. (No Month).

Q. Su, et al., "Martensitic transformation in Ni50Ti50 films", SPIE vol. 2189, pp. 409–412 (1994). (No Month).

V.S. Chernysh, et al., "Angular distributions of Ni and Ti atoms sputtered from a NiTi alloy under He+ and Ar+ ion bombardment", Nuclear Instr. And Methods in Physics Research B 140, pp. 303–310 (1998). (No Month).

I. Neshev, et al., "Sputtering of NiTi alloys: a comparison of experiment and simulation", Vacuum vol. 44, Nos. 3–4, pp. 209–212 (1993). (No Month).

Ken K. Ho, et al., "Modeling and measuring the response times of thin film TiNi", SPIE Proceedings Smart Mat. Tech., vol. 3040, San Diego, CA, Mar. 3–4 1997, pp. 10–22.

E. Quandt et al., *Sensors and Actuators* A53 (1995) Sputter Deposition of TiNi and TiNiPd Films Displaying the Two Way Shape Memory Effect.

Bendahan Marc et al., "NiTi shape memory alloy thin films: composition control using optical emission spectroscopy", Thin Solid Films 283 (Sep. 1996), pp. 61–66.*

Krulevitch, P. et al., "Mixed–sputter deposition of Ni–Ti–Cu shape memory films", Thin Solid Films 274 (Mar. 1996), pp. 101–105.*

Miyazaki, S., et al., "Martensitic transformations in sputter–deposited Ti–Ni–Cu shape memory alloy thin films", Thin Solid Films 281–282 (Aug. 1996) pp. 364–367.*

Chen, J.Z., "Crystallization behavior of r.f.–sputtered TiNi thin films", Thin Solid Films 339 (Feb. 1999). pp. 194–199.*

Ho, Ken et al., "Sputter deposition of NiTi thin film exhibiting the SME at room temperatures", Proceedings of the Symposium, 1998 ASME International Mechanical Engineering Congress and Exposition, Nashville TN, Nov. 14–19, 1999.*

Gabry, B., et al., "Thermodynamic modeling of the recovery strains of sputter–deposited shape memory alloys Ti–Ni and Ti–Ni–Cu thin films", Thin Solid Films 372 (Sep. 2000), pp. 118–133.*

Ho, Ken K. et al., "Sputter deposition of NiTi thin film shape memory alloy using a heated target", Thin Solid Films 370 (Jul. 2000), pp. 18–29.*

Surbled, P. et al., "Shape memory alloys for micromembranes actuation", LIMMS/CNRS–IIS, Institute of Industrial Science, University of Tokyo 7–22–1 Roppongi, Minato–ku, Tokyo 106–8558, Japan, 7 pages (no date).*

Ken K. Ho, John. J. Gill and Gregory P. Carman, "Sputter deposited NiTi thin film SMA for active flow control", 11 pages (no date).*

* cited by examiner

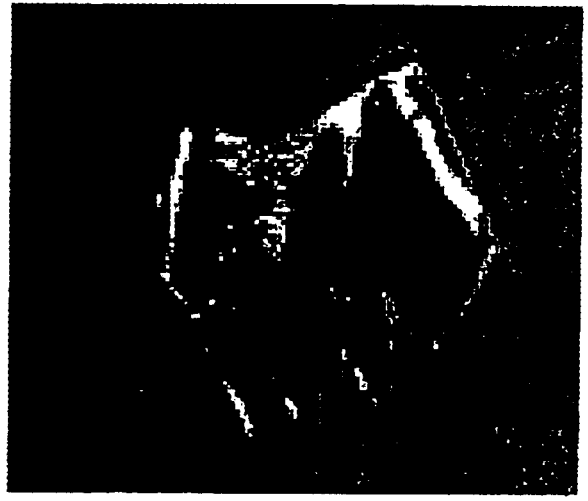
FIG. 7a 25°C
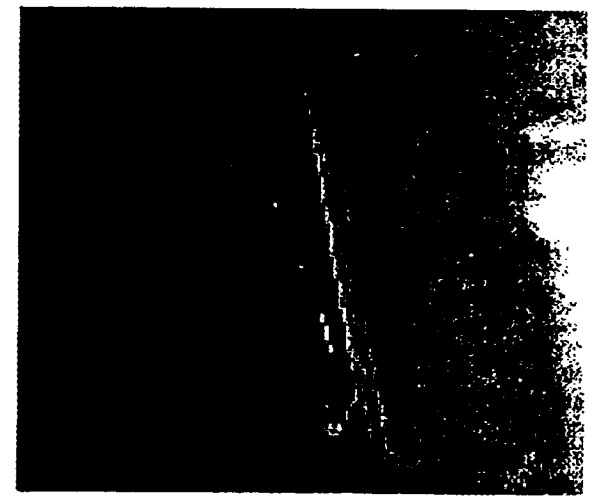
FIG. 7b 150°C
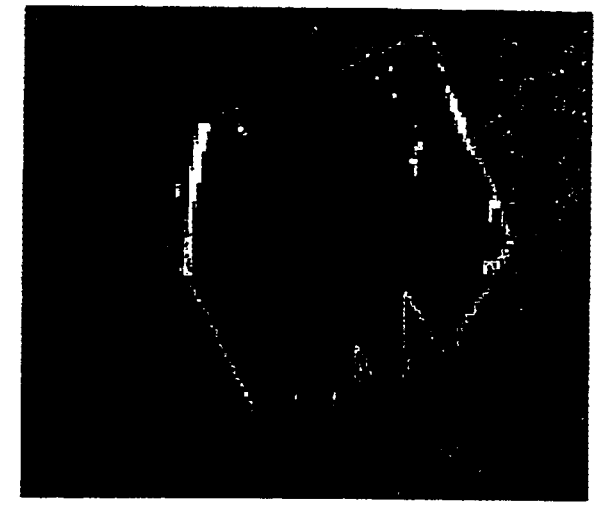
FIG. 7c 25°C heated shape cold shape

BIMORPHIC, COMPOSITIONALLY-GRADED, SPUTTER-DEPOSITED, THIN FILM SHAPE MEMORY DEVICE

CROSS-RELATED APPLICATIONS

This is a continuation of application Serial No. 09/795,555, filed Feb. 28, 2001, now abandoned, which claims the benefit of U.S. Provisional Application No. 60/185,841, filed Feb. 29, 2000 in the names of Ken H. Ho, Gregory P. Carman, and Peter A. Jardine, entitled "Bimorphic, compositionally-graded, sputter-deposited, thin film shape memory device".

STATEMENT REGARDING FEDERALLY SPONSORED RESEARCH

This invention was made with Government support under Grant No. F49620-98-1-0058, awarded by the Department of the Air Force, Air Force Office of Scientific Research (AFOSR) and Grant No. CMS-9622283, awarded by the National Science Foundation. The Government has certain rights in this invention.

FIELD OF THE INVENTION

The present invention relates to a shape memory device that exhibits cyclical shape change, and the process for producing the same. In one embodiment, a multi-alloy NiTi thin film is deposited by DC sputtering.

BACKGROUND OF THE INVENTION

NiTi is a shape memory alloy (SMA) that is capable of recovering strains on the order of 10%. This effect, referred to as the shape memory effect (SME), occurs when the material undergoes a phase transformation from the low temperature martensitic phase to the high temperature austenitic phase. In the martensitic phase the material is deformed by preferential alignment of twins. Unlike permanent deformations associated with dislocations, deformation due to twinning is fully recoverable when heated to the austenite phase.

A difficulty in using thin film SMA is that the deposited films exhibit the one way shape memory effect (SME) only. An SME material recovers its original shape after heating to the austenite phase but does not revert back to its deformed state when cooled. In order to achieve cyclic actuation, a biasing force such as a spring is necessary to deform the material when in the martensite phase. Implementing a bias force on thin film structures present significant manufacturing obstacles, an additional challenge for using thin film SME in MEMS actuators.

The first work to incorporate thin film NiTi in devices used a micro-machining process developed by Walker et al. in 1990 [J. A. Walker, K. J. Gabriel, and M. Mehregany, Sens. Actuators, Vols. A21–A23, p. 243, 1990]. Walker et al. used a wet chemical etchant (HF+HN03+H20) to pattern a free standing serpentine NiTi spring. The structures were curled when released and uncurled when heated, they attributed this to the shape memory effect. However, the films were amorphous as deposited. In 1990 Bush and Johnson at the TiNi Alloy Company showed the first definitive evidence of SME in NiTi films [J. D. Busch, A. D. Johnson, et. al., "Shape-memory properties in Ni—Ti sputter deposited film", J. Appl. Phy., Vol.68, p.6224, 1990]. Using a single target (50/50 atm % NiTi), with a DC magnetron sputtering system they pre-sputtered for 3 hours. Sputtering of the film was performed with a $P_{Ar}$=0.75 mTorr, V=450V, I=0.5A, and a target substrate distance of 2.25 inches was used. The as-deposited, film was shown by XRD to be amorphous and, after vacuum annealing at 550° C. for 30 minutes, exhibited the SME although transformation temperatures were 100° C. lower than the target material.

To achieve a cyclical, two-way effect, abiasing force is required to reshape the NiTi when cooled. Kuribayshi introduced a biasing force by tailoring precipitates in his films such that there were compressive and tensile stresses on opposite sides of his film [K. Kuribayashi, T. Taniguchi, M. Yositake, and S. Ogawa, "Micron sized arm using reversible TiNi alloy tin film actuators". Mat. Res. Soc. Symp. Pro., vol.276, p.167, 1992]. The film curled when in the martensitic phase and when heated to the austenite phase flattened because the higher modulus overcomes the residual stresses. The fabrication process required complicated heat treatments. The stability of these precipitates can degrade over numerous thermal cycles.

Thin film TiNi actuators are well suited for MEMS devices because of their large work energy densities. However, the difficulties associated with depositing this material has limited its access by the MEMS community. To address this issue, researchers focused on deposition, heat treatments, and thermomechanical characterization of the film [J. D. Busch, M. H. Berkson, and A. D. Johnson, Phase transformations in sputtered NiTi film: effects of heat treatment and precipitates. Mat. Res. Soc. Symp. Proc., vol.230, p. 91, 1992; D. S. Grummon and T. J. Pence, "Thermotractive titanium-nickel thin films for microelectromechanical systems and active composites", Mat. Res. Soc. Symp. Pro., Vol. 459, p. 331, 1997; Q. Su, S. Z. Hua and M. Wuttig, "Martensitic transformation in NiTi films", J. of Alloys and Compound, vol. 211, p.460, 1994; S. Miyazaki, et.al., "Shape memory characteristics of sputter-deposited Ti—Ni base thin films", SPIE, vol. 2441, p. 156, 1995; and A. Ishida, A. Takei, M. Sato and S. Miyazaki, "Shape memory behavior of Ti—Ni thin films annealed at various temperatures", Mat. Res. Soc. Symp. Proc., vol.360, p. 381, 1995. 11–15]. Few researchers developed actual microdevices.

The TiNi Alloy Co. has a working microvalve it markets, which closes using a bias mass and opens when the thin film NiTi ligaments are heated [C. A. Ray, C. L. Sloan, A. D. Johnson, J. D. Busch, B. R. Petty: Mat. Res. Soc. Symp. Proc. 276, 161 (1992)]. Krulevitch et al. fabricated a 900 m long, 380 m wide, and 200 m tall microgripper from 5 m thick NiTi—Cu film, as well as a functioning microvalve [P. Krulevitch, et al, supra]. Benard et al. fabricated a micropump from NiTi film using two designs: polyimide as the biased actuator in one and a complementary NiTi actuator in the other [W. L. Benard, H. Kahn, A. H. Heuer and M. A. Huff, "Thin film shape memory alloy actuated micropumps", J. of Microelectromechanical Systems, vol.7, no. 2, 1998]. Kuribayashi et al. used TiNi films to actuate a microrobotic manipulator [K. Kuribayashi, S. Shimizu, T. Nishinohara and T. Taniguchi, "Trial fabrication of micron sized arm using reversible TiNi alloy thin film actuators", Proceedings International Conf. On Intel. Robots and Sys., Yokohama, Japan, p. 1697, 1993]. While the potential applications for SMA MEMS are large, the difficulties with fabricating quality material and achieving the two-way effect is preventing wide spread use of this actuator material.

NiTi films with transformation temperatures above room temperature are difficult to manufacture. Sputtering directly from a 50/50 atm % NiTi target results in films with dramatically lowered transformation temperatures, prohibiting its use as an actuator [J. D. Busch, et. al., supra]. This is caused by the fact that NiTi alloys are strongly dependent on composition, annealing temperatures, aging time, and sputtering parameters [S. Miyazaki, et.al., "Effect of heat treatment on deformation behavior associated with R-phase and martensitic transformations in Ti—Ni thin films", Trans. Mat. Res. Soc. Jpn., Vol. 18B, pp1041, 1994; A. Ishida, M. Sato, A. Takei and S. Miyazaki, "Effect of heat treatment on shape memory behavior of Ti-rich Ti—Ni thin films", Materials Transactions, JIM, vol. 36, p. 1349, 1995; and A. Peter Jardine, "Deposition parameters for sputter-deposited thin film TiNi", Mat Res. Soc. Symp. Proc., Vol 360, p. 293, 1995]. Of these factors, alloy composition is the most critical.

NiTi alloys and other shape memory alloys are strongly dependent on composition, annealing temperatures, aging time, and sputtering parameters. Composition is the most critical sputtering parameter. Typically, small changes in composition occur during sputtering because titanium readily reacts with other materials. FIG. 1 shows the dependence of transformation temperature on Ni—Ti stoichiometry, a shift in composition of as little as 1 atm % can alter transformation temperatures by 100° C. [T. W. Duerig, K. N. Melton, D. Stockel and C. M. Wayman, Engineering Aspects of Shape Memory Alloys, 1990]. Titanium is typically used to getter materials, and is often used in vacuum systems to pull down a vacuum by reacting with the gases and condensing. Miyazaki, et al., compensated for the titanium loss by placing titanium plates on top of the alloy target, thereby effectively altering the composition of the target [S. Miyazaki and K. Nomura, "Development of perfect shape memory effect in sputter-deposited Ti—Ni thin films", Proceedings IEEE Microelectro Mechanical Sys., p. 176, 1994]. Wolf et al. similarly compensated with titanium foils [R. H. Wolf and A. H. Heuer, "TiNi (Shape Memory) Films on Silicon for MEMS Applications", J. of Microelectromechanical Sys., vol.4, no.4, p.206, 1995], and A. Gyobu et al. also recently sputtered from a 50/50 NiTi target using titanium compensation [A. Gyobu, Y. Kawamura, H. Horikawa, and T. Saburi, "Martensitic transformations in sputterdeposited shape memory Ti—Ni films", Mat. Trans. JIM, vol. 37, no. 1–6, p.697, 1996]. The other method of compensating for the titanium loss is to use a multigun co-sputtering system. For example, Krulevitch et al. used a DC magnetron system to sputter from individually powered Ni, Ti, and Cu targets [P. Krulevitch, A. P. Lee, P. B. Ramsey, et.al., "Thin film shape memory alloy microactuators", J. of Microelectromechanical Sys., vol.5, no.4, 1996].

A further complication is that the NiTi phase is very narrow at low temperatures. Slight shifts in the Ni:Ti stoichiometry can cause precipitate formation, and complicate the metallurgical heat treatment required to establish a desired transformation temperature. It would be advantageous to develop a simple approach that could produce a deposited film with composition similar to the target.

Thin film NiTi fabricated by sputtering offers a promising new material for solid state actuation in the MEMS field as well as new possibilities for medical devices, because of its large energy density(1 J/g) and large displacement (10% strain). Since NiTi SMA shape memory alloys are heat actuated, improved performance can be achieved at microscales. Frequencies of several hundred hertz can be achieved [J. Favalukis, A. S. Lavine, G. P. Carman: Proc. SPIE 3668, 617 (1999)]. Specifically, with a smaller mass and larger surface to volume ratio, heat transfer is substantially increased, power requirements are lowered, and large stresses and strains are achievable. These advantages make NiTi SMA a very promising actuation mechanism fort microdevices.

Sputtering of NiTi thin film from a 50/50 atm % NiTi target produces films with transformation temperatures different from the target due to loss of titanium during sputtering. NiTi films with transformation temperatures above room temperature are difficult to manufacture. Sputtering processes typically produce films with reduced transformation temperatures (i.e. below room temperature), requiring artificial cooling to use as an actuator. Researchers have compensated for this, by placing Ti plates on the target to effectively alter the composition of the target, or to sputter off of a nonstoichiometric NiTi target.

A microscale actuator for active flow control could be implemented using the SME. In recent years the combined evolution of MEMS (microelectro-mechanical systems) technology and active materials has produced advancements that can make Active Flow Control (AFC) practical [C. M. Ho and Y. Tai, "Mems: Science and Technology," Application of Microfabrication to Fluid Mechanics, FED V. 197, ASME 1994, pp. 39–49, 1994]. Active Flow Control (AFC) represents an advanced concept for reducing drag, controlling flow separation, improving flight control effectiveness, and manipulation of wake vortex interactions in aircraft systems. The AFC concept has been around for the last 30 years. The obstacle to its successful implementation has been a lack of a compact rugged sensor-actuator technology.

SUMMARY OF THE INVENTION

Previously, it was difficult to sputter deposit NiTi films with transformation temperatures above 25° C. from a single unmodified 50/50 atm % NiTi target. The present invention achieves transformation temperatures above 25° C. from an unmodified 50/50 atm % NiTi target by increasing the temperature of the target during deposition of the NiTi thin film. Furthermore, this process for the production of SME thin films produced a film that exhibited two-way SME without an external bias force.

The present invention is directed to a two-way NiTi thin film shape memory effect device and a method for fabrication of such a device by depositing (a 50/50 atm %) NiTi thin film by DC sputtering. The films have a transformation temperature about the same as the transformation temperature of the target material. One embodiment of the invention involves heating the target to temperatures greater than about 400° C. before depositing the NiTi SME thin film on the substrate.

Specifically, this method for fabrication does not require compositional modification of the 50/50 atm % NiTi target. Films that were produced by gradual heating of the target during deposition of the thin film produced a compositionally graded film. The compositional gradation occurs through the film thickness. By gradation, we mean a gradual change in the composition of the sputter deposited material. This gradation produced films exhibiting a two-way SME. The simplicity of this new process can increase the commercial use ofNiTi thin films in microactuator devices by reducing fabrication complexity and costs. The control over the composition by control of the target temperature allows the transition of the martensite to austenite to occur at a temperature above room temperature. Therefore, practical devices can be fabricated that require only heating to cause a shape change. The two-way SME effect means that the device can be repeatedly cycled by heating and cooling, changing shape with each cycle without any external bias force.

These and other features, aspects, and advantages of the present invention will be better understood with regard to the following detailed description and accompanying drawings.

BRIEF DESCRIPTION OF THE FIGURES

For the purpose of illustrating the invention, representative embodiments are shown in the accompanying figures, it being understood that the invention is not intended to be limited to the precise arrangements and instrumentalities shown.

FIGS. 7(a–c) show a free standing NiTi film exhibiting the two way shape memory effect.

FIGS. 11 (a–d) are XRDs of films sputtered with a cold target and substrate heating is at 200 C.

FIGS. 13 (a–b) show a DSC of film deposited from a hot target.

FIGS. 29(a–c) show the optical micrographs of martensitic platelets at 25° C.

DETAILED DESCRIPTION OF THE PREFERRED EMBODIMENTS

The present invention will now be described in detail for specific preferred embodiments of the invention. These embodiments are intended only as illustrative examples and the invention is not to be limited thereto.

Sputtering from a multi-alloy target produces a film with a composition slightly different than that of the alloy. By heating the target, the composition of the deposited film was more closely matched to the composition the target compared to a target maintained at lower temperature. A sputtering gun was designed that allowed control of the temperature of the target material. Therefore, target materials can be sputtered producing films with composition closer to that of the target than previously possible. This has applicability in all areas of sputter deposition. For example, the hard-drive industry would benefit by this process by controlling the composition more precisely, translating to a higher storage density.

In one embodiment of this invention, the correlation between target temperature and composition was used to produce a gradient in the film composition (a compositionally graded thin film), wherein the gradient in the film composition was produced through the thickness of the film by varying the target temperature. In the case of NiTi shape memory alloy, where the transformation temperature is very sensitive to composition, compositionally graded film produced a bimorphic film of austenite and martensite. This compositionally graded film was seamless. More importantly, the bimorphic film produced a device with two-way shape memory effect. In this embodiment of the invention, no compositional modification of the target material was necessary to achieve this two-way SME. This novel method of producing the two-way effect without further heat treatments is ideal for use as a cyclic actuator material for microdevices, because the shape memory effect can be invoked repeatedly by heating and cooling the device without application of any external bias force.

Figure 3:
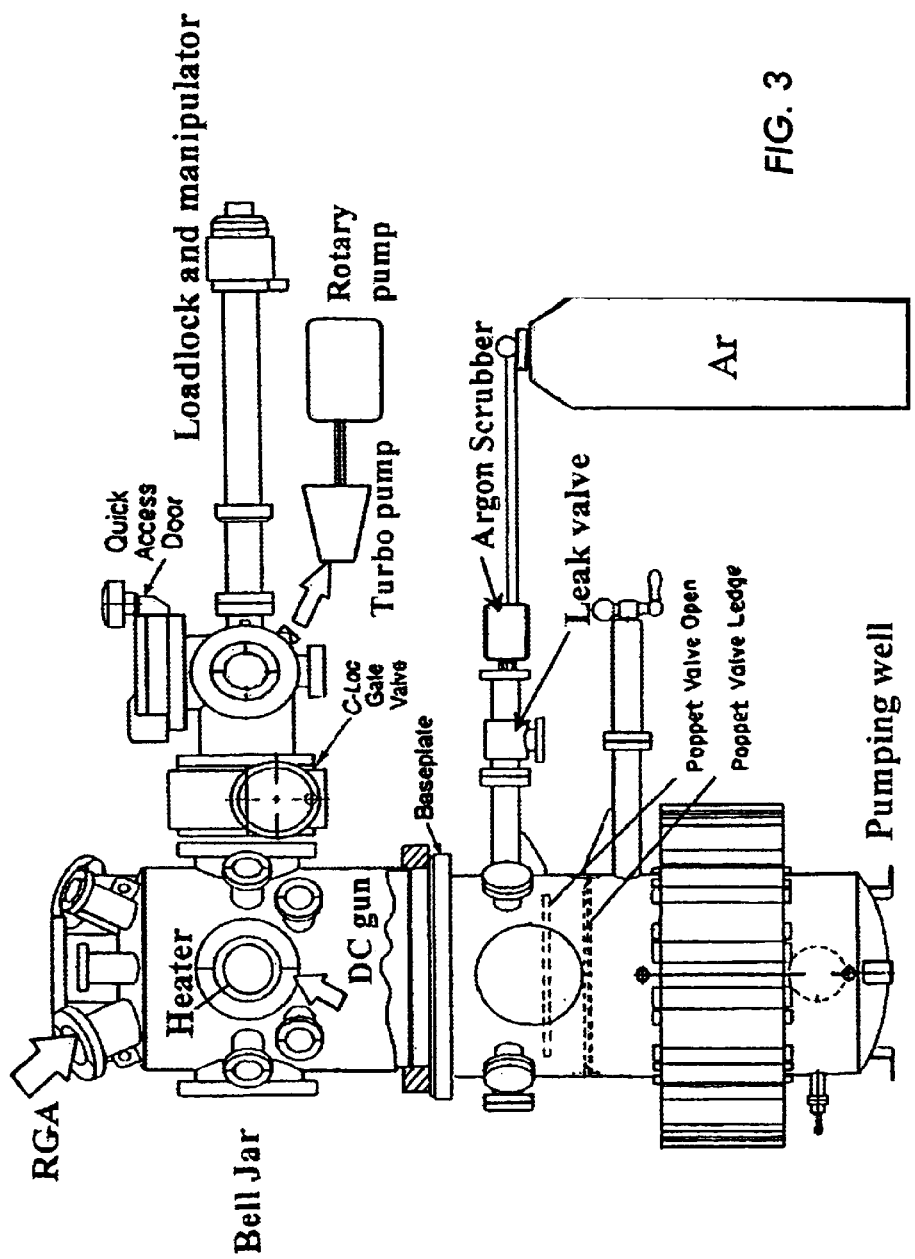
FIG. 3 is a schematic of UHV sputtering system for thin film NiTi.

In a representative embodiment of the present invention, a sputtering system was fabricated at UCLA to deposit NiTi thin films on substrates. The system was designed to be ultra clean and free from contamination during processing. A picture and schematic of the system is shown in FIG. 3. The system is UHV (ultra high vacuum) compatible with a loadlock to decrease pump down time as well as eliminate contamination. An Stanford Research Systems residual gas analyzer (RGA) was present to monitor contamination levels, particularly oxygen and water pressure, prior to sputtering. An argon scrubber was used to further clean the 99.999% purity argon gas. Sputtering was done with a 3" DC magnetron gun from US Thin Film Products Inc. An in-situ heater with rotation capability was used to crystallize the films. The target was cut from a 3" diameter boule of nearly stoichiometric Ni:Ti purchased from Special Metals.

Figure 4:
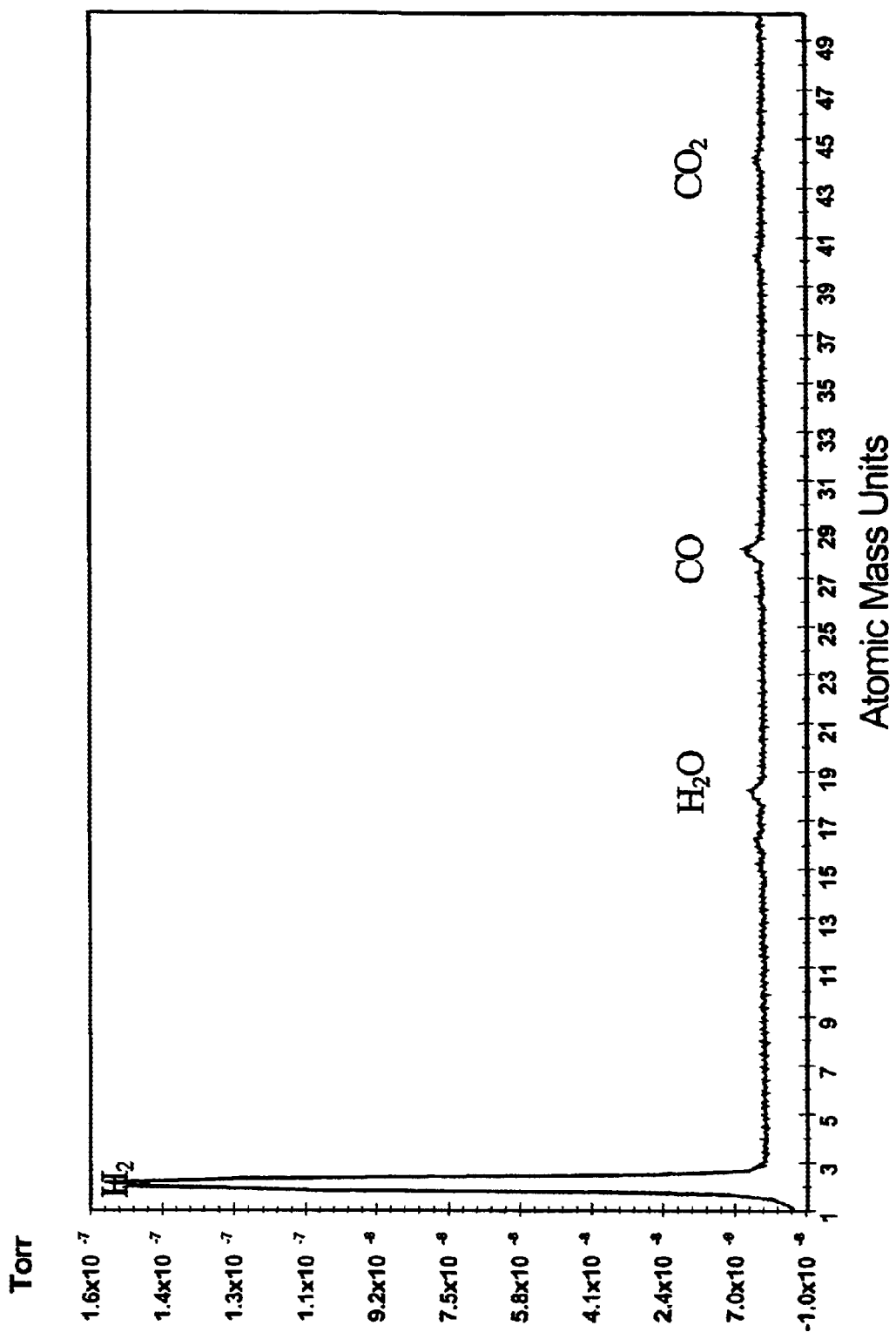
FIG. 4 is a graph showing the pressure of $H_2O$, $CO_2$ and CO gases during representative sputtering runs.

In this embodiment of the invention, prior to each run, residual gas measurement were taken with the RGA to ensure a minimal amount of contamination. Initial RGA scans prior to bakeout of the vacuum system, indicate that $H_2$, $H_2O$, $CO_2$ and CO were the primary gases in the system. Because of the highly reactive nature of Ti these gases can deplete the amount of Ti reaching the substrate. For this reason $H_2O$, $CO_2$ and CO gases were kept below $10^{-8}$ Torr (FIG. 4) for all sputtering runs. The $H_2$ gas had values above $10^{-8}$ Torr, but $H_2$ gas does not react with Ti as readily.

In a typical embodiment of the invention, NiTi films were deposited using the following parameters: base pressures less than $5 \times 10^{-8}$ Torr, $P_{Ar}$=2.0 mTorr, target substrate distance=3 cm–4 cm, and power=300 W. The films were crytallized by heating the substrate to greater than about 500° C. and holding it at this temperature for about 10 minutes in situ prior to removal from the sputtering system. Deposition rates at these conditions were approximately 225 nm/min as determined from film thickness measurements using a profilometer. The mean free path for molecular collision is given by the following equation:

$$\lambda = \frac{kT}{\sqrt{2}\, P\pi\sigma^2} \quad (1)$$

where k is the Boltzmann's constant, T is the absolute temperature, P is pressure, σ is molecular diameter which is roughly $10^{-8}$ cm for gases [L. G. Carpenter: Vacuum Technology An Introduction (Adam Hilger Lrd, Bristol 2nd Edition, (1982).]. Table I lists the mean free path calculated from equation 1, at different pressures. The $H_2O$, $CO_2$ and CO gas pressures prior to sputtering are below $10^{-8}$ Tor, which corresponds to a mean free path of greater than about 7 cm. Thus, with a target substrate distance of 4.0 cm, there is negligible molecular interaction between the Ti and impurities that would form Ti-oxides. Also, since Ti does not react appreciably with $H_2$ and Ar, there should be negligible Ti loss due to gettering effects as the material is sputtered. However, by slightly increasing the pressure of these gases to 5×10-8 Tor, mean free path reduces to 1.4 cm. Now, molecular collisions between Ti and the gases would cause Ti depletion.

EXAMPLES OF THE INVENTION

Figure 5:
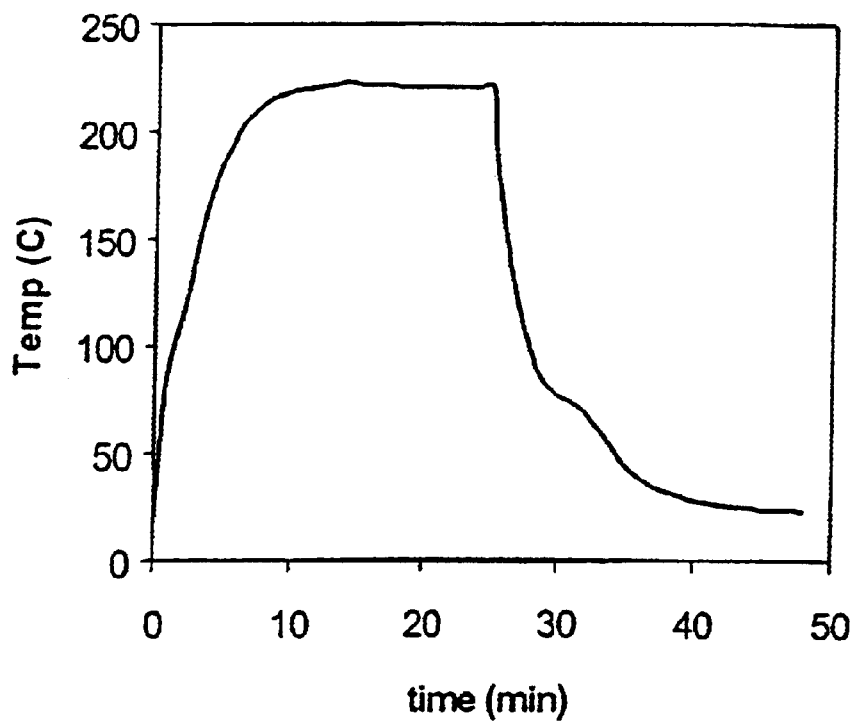
FIG. 5 is a graph showing the temperature profile of the target during a cooled target sputtering run.

In one example (sample C), the film was produced by sputter deposition from a cold target, initially less than 100° C. The target was cooled by thermal contact with a copper chill block. The target temperature, as measured using a thermocouple, stabilized at 225° C. during sputtering (FIG. 5).

Figure 6:
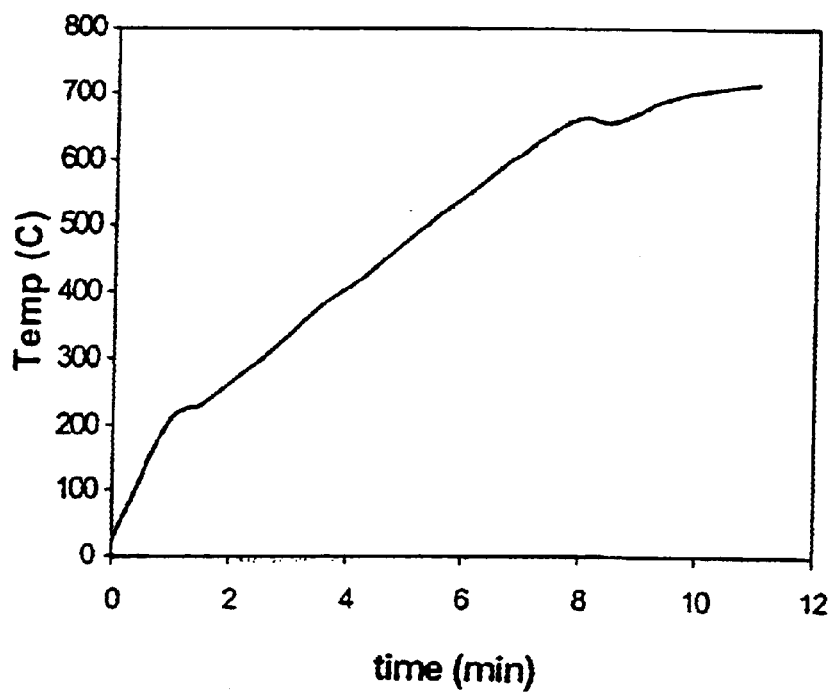
FIG. 6 is a graph showing the temperature profile of the target during a heated target sputtering run.

In a second example (sample T), the target temperature during sputtering was increased from a low temperature to a high temperature, as shown in FIG. 6. The temperature of the target was increased to greater than 700° C. during deposition of the NiTi film. The higher temperature was achieved by reducing or eliminating the thermally conductive paste between the target and the copper chill block, producing a thermal barrier to conduction of heat into the chill block.

In a third example of the sputter deposition process (sample H), the temperature of the target was initially increased to greater than about 400° C. before deposition of NiTi on the substrate. This was achieved by masking or shielding the substrate during an initial warming of the target. In one emodiment, the initial warming took about 4 minutes. Then, the substrate was exposed, and sputter deposition on the substrate commenced.

The thickness of the C and T films, using a profilometer, were found to be approximately 2.5 μm thick. The H sample was only about 0.9 μm thick. The temperature profile of the hot target as a function of sputtering time is presented in Table II.

After deposition, Sample C was shiny and crystallized, indicating a high modulus austenite phase. However, Sample H was cloudy when cooled and shiny when heated. Sputtered films have tensile residual stresses such that when the NiTi film is in the martensitic phase it accommodates these stresses by twinning, thus its surface is more textured and therefore appears cloudy. Test results confirmed that at room temperature Sample C was austenite and Sample H was martensite.

Alternative substrate materials were used for depositing the NiTi thin films, including 4-inch silicon wafers, glass slides, nitride wafers and oxide wafers. Regardless of the substrate material, it was found that Sample H and Sample C retained there respective texture. It is expected that other substrates known in the art could be used for depositing thin SME films.

A discussion of these results follow. Materials characterization on the sample films were done to determine their crystalline phase, transformation temperatures and atomic composition. XRD, DSC, four-point probe, RBS, and TEM techniques were employed for this end.

Heating the target also radiatively heats up the substrate. This was thought to be a possible mechanism that might be responsible for stabilizing the composition during sputtering. To address this issue, the substrate was heated to four different temperatures while the target was is kept cold. Films were sputtered with the substrate heated to 200° C., 300° C., 500° C., and 600° C. XRD presented later will show that the films were austenitic and not martensitic at room temperatures. Thus, the process of heating the target during sputtering is not equivalent to conventional substrate heating. One of ordinary skill in the art would not expect that merely heating the substrate would produce compositionally graded, two-way SME thin films.

Cleanliness of the target was another issue. Heating the target degasses any contaminants present on the surface. To evaluate if this contributed to the difference in transformation temperatures between Samples H and C, pre-sputtering was performed. The cold target was pre-sputtered for two hours, which would be sufficient to remove any surface contaminants and achieve uniformity in the sputtering rates. Pre-sputtering did not influence the material properties; therefore, we concluded that pre-sputtering had negligible effect in altering the transformation temperatures of Sample C.

In contrast, Sample H was presputtered for only 10 minutes in one run and subsequent runs were not pre-sputtered. This is possible because the loadlock keeps the target in constant vacuum. Clearly, pre-sputtering and target cleanliness did not contribute to altering the transformation temperatures of Sample H specimens.

Figure 8A:
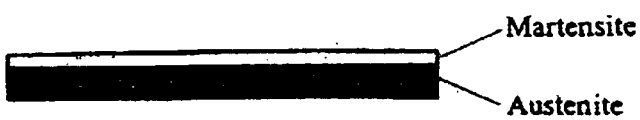
FIGS. 8(a–b) show the gradation of film due to gradual heating of the target accounting for the two-way SME (FIG. 8a) and (FIG. 8b) shows a tailored 2D bimorph structure.

The Sample H films exhibited a two-way shape-memory effect. The resulting two-way effect is intrinsic and does not require further heat treatments. FIGS. 7(a–c) shows the film at three stages: 25° C., 150° C., and back to 25° C. Without external biasing of the film, the film is initially flat, curled when heated and uncurled when cooled back to room temperature. We attribute this to the fact that the film is compositionally graded through its thickness. Although the invention is not limited by this interpretation, the inventors believe that the lower part of the film is austenite and the top part is martensite, creating a superelastic system combined with a shape memory system (FIG. 8a). The inventors suppose that, as the target temperature increases during deposition, compositional changes in the film cause a transition from austenitic to martensitic phase. When the film is heated, the upper martensite transforms to austenite, causing the film to curl. When cooled the stresses induced by the thin austenite layer are sufficient to twin the martensite and return the film to the flat configuration. The two-way effect has also been used to fabricate a MEMS bubble actuator.

Likewise, the T films also exhibited a two-way shape-memory effect, without further heat treatments, see FIGS. 7(a–c). Without any external biasing the film initially flat, curled when heated and uncurled when cooled back to room temperature. We attribute this to the nonuniform properties across the film thickness. The gradation of properties is sufficient to produce the two-way SME.

Figure 8B:
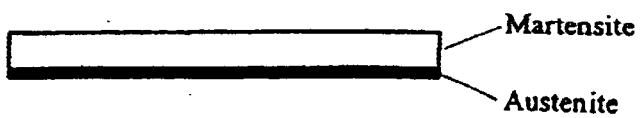

Control of the temperature of the target allows a tailored two-dimensional austenite-martensite bimorph to be fabricated (FIG. 8b). The proportion of austenite to martensite can be tailored resulting in a predefined force-displacement response.

One advantage of the present invention is that a two-way SME thin film can be produced without complicated compositional modification or use of a multigun cosputtering system. The process of using titanium plates or foils to modify the composition has the problem of repeatability as the plates wear down. Using a multigun system not only requires expensive equipment, but a calibration of each gun to the proper sputtering deposition conditions. Generally, this means that two-way SME thin films can be produced at higher rates of production and lower cost than previously achievable. The present invention is both inexpensive to implement and produces repeatable film compositions run after run.

Figure 9:
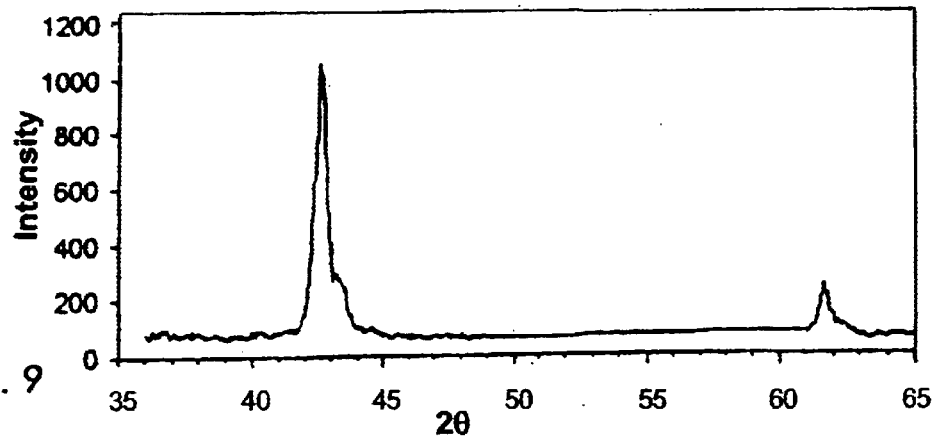
FIG. 9 is an X-ray diffraction (XRD) of film sputtered from a cold target indicating an austenite phase at 25 C.
Figure 10A:
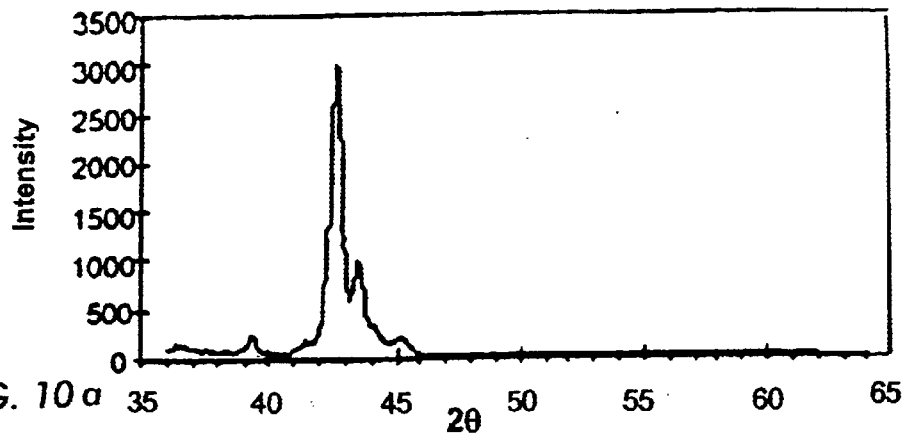
FIGS. 10(a–b) are XRDs of film sputtered from a hot target (FIG. 10a) and an XRD of film after cycling to –100 C. then back to 25 C.
(FIG. 10b) wherein the film is completely martensitic.
Figure 10B:
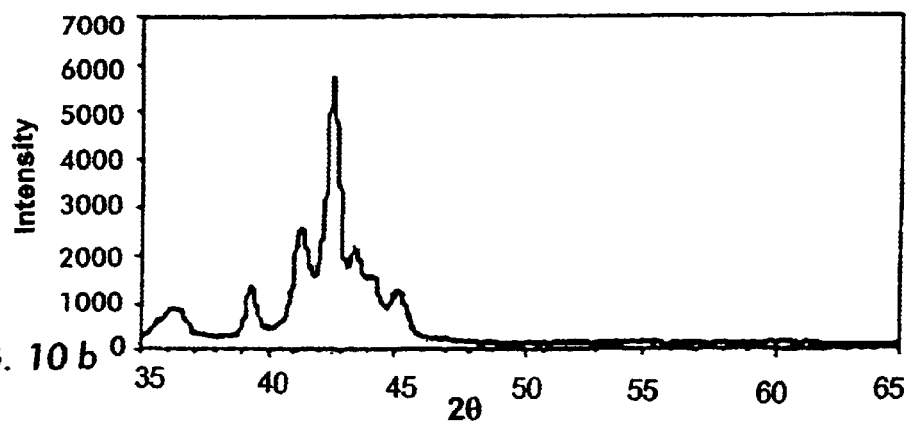
Figure 11A:
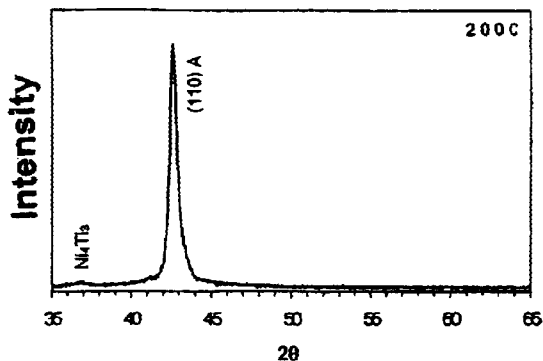
(FIG. 11a); 300 C.
Figure 11C:
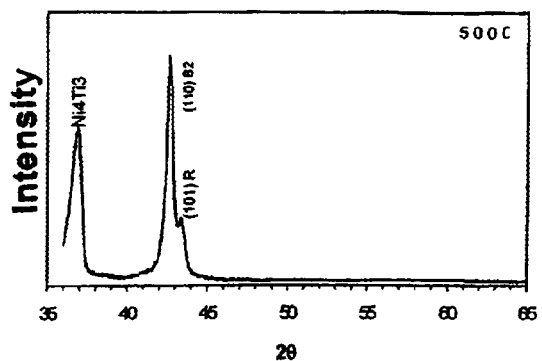
(FIG. 11c); and 600 C.
Figure 11B:
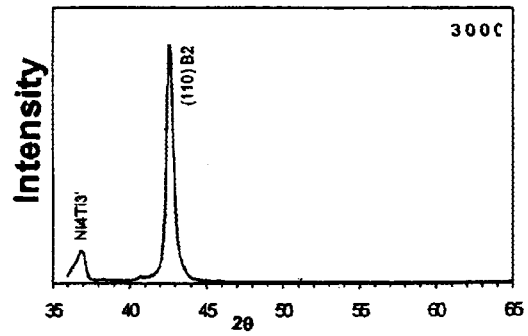
(FIG. 11b); 500 C.
Figure 11D:
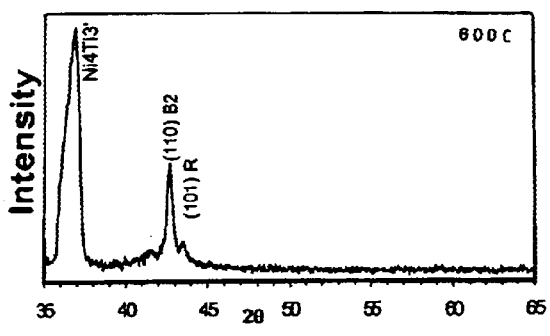
(FIG. 11d). The extra diffraction peak at 2 $\theta$=37 grows with increasing substrate temperature and corresponds to silicide formation at the film silicon substrate interface.

XRD (x-ray diffraction) was performed on the samples to determine the NiTi film's crystalline phase. Sample C films displayed XRD patterns at 25° C. indicative of an austenite phase (FIG. 9). XRD on Sample H films immediately after deposition indicated that the material was not completely martensitic, but a mixture of martensitz and austenite (FIG. 10a). When cycled down to −100° C. then back to 25° C., XRD patterns indicated that Sample H films were completely martensitic (FIG. 10b). The film therefore exhibits a hysterisis seen in bulk NiTi due to the growth and shrinkage of martensitic regions within austenite. The difference however, is that the austenite and martensite in our film is believed to be compositionally graded through the thickness, rather than randomly distributed phases found in bulk NiTi.

To verify that heating the target was not indirectly causing substrate heating, samples were deposited on a hot substrate while keeping the target cold. XRD of these samples are given in FIGS. 11 (a–d). The films were deposited on a hot substrate at four different temperatures 200° C., 300° C., 500° C., and 600° C. and subsequently annealed at 500° C. for 6 minutes after deposition to ensure that the films were crystallized. XRD confirm that all films are austenitic at room temperatures. Cycling the temperature down to −50° C. and back to 25° C. did not alter the XRD patterns. An extra peak in the XRD at 2 θ=37.7° begins appearing at higher substrate temperatures and grows with increasing substrate temperatures (see FIGS. 12(a–c)). This peak corresponds to a $Ni_4Ti_3$ precipitate peak. Substrate heating did not produce martensitic films. Instead, substrate heating induced precipitate growth.

Figure 12A:
FIGS. 12(a–c) are magnifications of precipitates at 105,000× magnification, dark field images (FIG. 12a), at 37,500× magnification, bright field image (FIG. 12b) which shows variation in grain size of between about 0.1–1 $\mu$m, and at 380,000× magnification, bright field image (FIG. 12c) which shows 20 nm—sized precipitates.
Figure 12B:
Figure 12C:

To confirm the presence of the precipitates, TEM studies were done on the 600° C. substrate heated sample. The sample was initially 3 μm thick and was thinned down using an ion mill. FIGS. 12(a–c) show the presence of intergranular precipitates verifying the XRD results. These will influence the shape memory response and produce a more brittle film. The precipitates were measured to be 20 nm in size. The NiTi grains vary from 0.1 μm to 1 μm in size. Atomic force microscope results of the H film showed a comparable grain size.

Figure 13A:
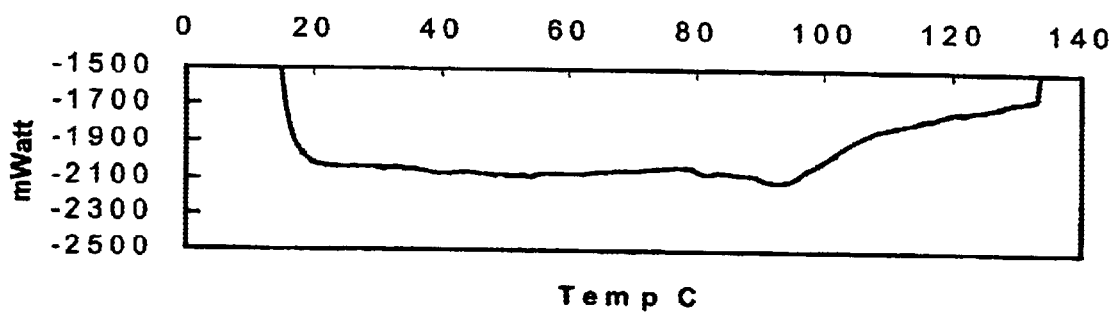
FIG. 13a shows the DSC heating.
Figure 13B:
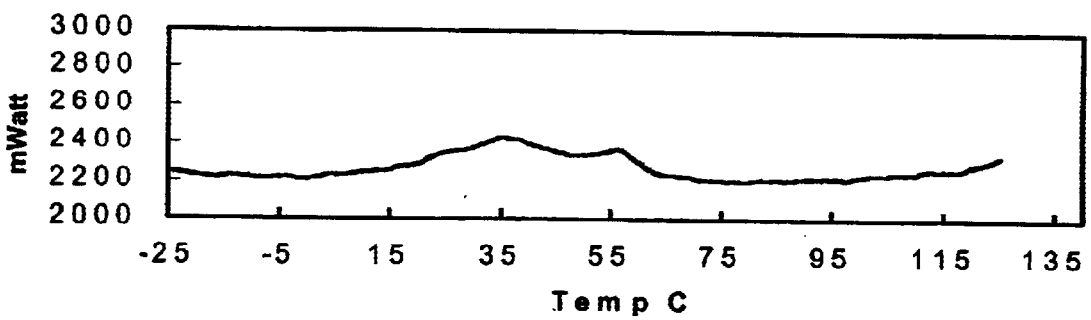
FIG. 13b shows the DSC cooling.
Figure 14:
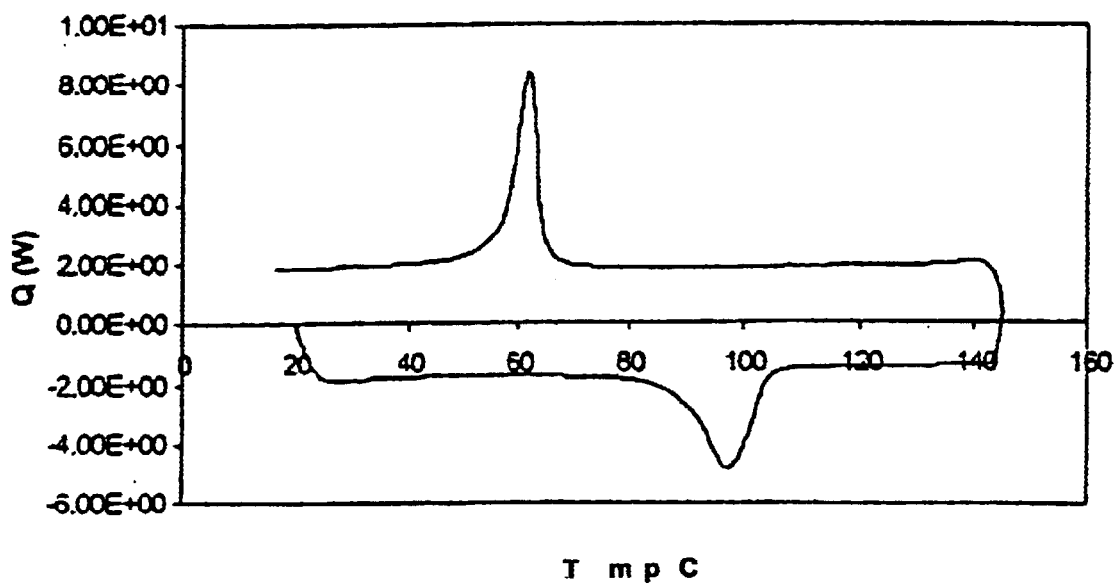
FIG. 14 shows the DSC of a typical rolled film.

Transformation temperatures for the film were measured first with a DSC. DSC results for the H sample given in FIGS. 13(a–b). Data shows a peak that is short and broad in width during the exothermic martensit to austenite transformation and the endothermic austenite to martensite transformation. The area under these peaks correspond to the latent heat of transformation, such that a short and broad peak would indicate that martensite is growing and shrinking in different regions at different martensite and austenite temperatures. This would indicate that Sample H films were not uniform across the thickness, but rather were transforming over a broader temperature region. This corresponds with the observed two-way SME. FIG. 14 is the DSC of a rolled film showing transformation points that are more distinct, typical of a film with more uniform phases. Transformation temperature results from DSC of the Samples C and H compared to the $T_f$ of the target material is given in Table II. The $T_f$ of Sample H was comparable to that of the target indicating that there was very little compositional deviation from the target material.

The mechanical properties of Sample H films were characterized in an MTS microforce testframe. Sample H films 3.5 μm thick, 1.5 cm in length and 4.5 mm in width were prepared.

Figure 15A:
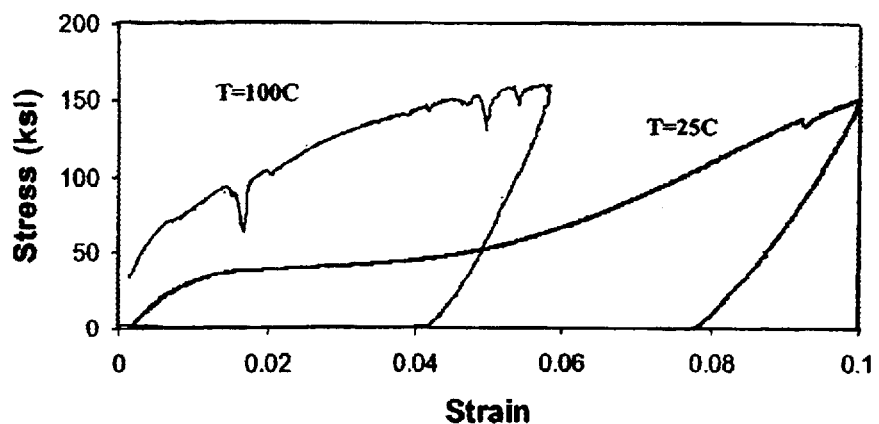
(FIG. 15a) and of a strip of target material (FIG. 15b).
Figure 15B:
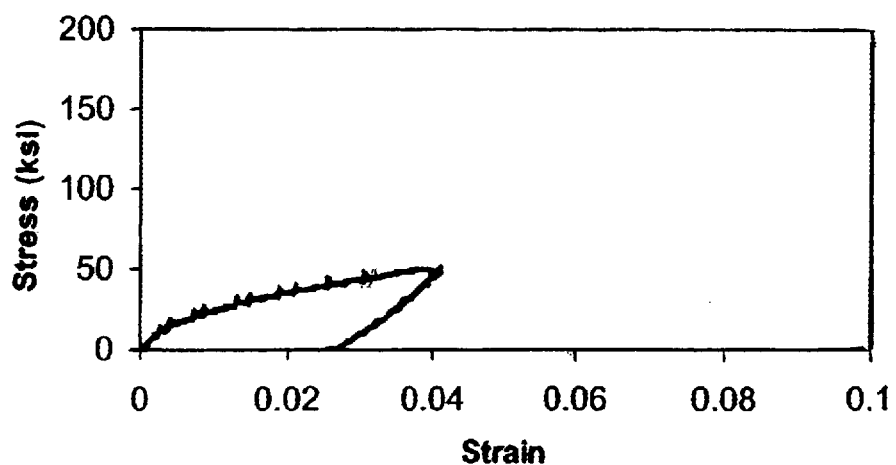
FIGS. 15(a–b) are graphs representing the stress-strain curves of sputtered film at 100° C. and 25° C.
Figure 16:
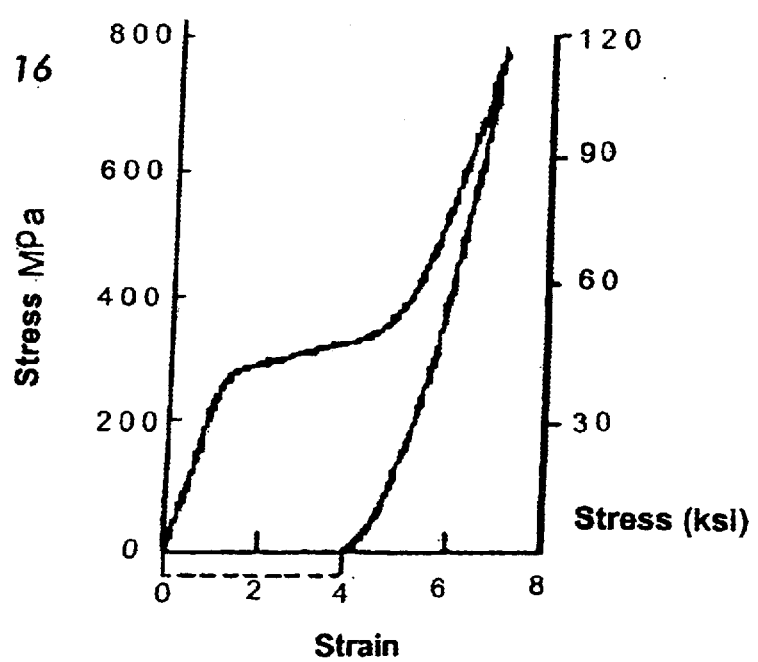
FIG. 16 is a graph representing the stress strain curve results of sputtered film of the prior art.

The stress strain curves of an H films at two temperatures are shown in FIG. 15a. During the 100° C. run the film was heated with a heat gun and temperature was measured with a thermocouple near the film. Slight temperature fluctuations produced by the heat gun accounted for the discontinuity in the curve. The film produces i recovery strain of 5%, and failure does not occur until strains greater than 10% are applied. The maximum recovery force defined by the load when the film is heated to the austenite phase is 150 ksi. Tensile tests were also performed on a strip of target material 1.5 cm in length, 2.5 mm in width and 0.16 min in thickness to give a reference (FIG. 15b). Due to the increase in sample size, stress was limited to below 45 ksi on the target sample. The two materials (i.e. the film and target) showed comparable yield strengths (i.e. 40 ksi). Films produced by Miyazaki by using titanium plates as compensation also have comparable mechanical characteristics as the H films (FIG. 16). For example both films begin showing increased stiffness after 4% strain indicating dislocation pile-up maybe occurring.

Figure 17A:
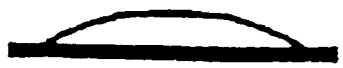
FIGS. 17(a–b) illustrate the actuator for active flow control in its heated shape (FIG. 17a) and its cooled shape (FIG. 17b).
Figure 17B:
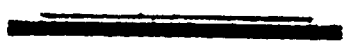
Figure 18:
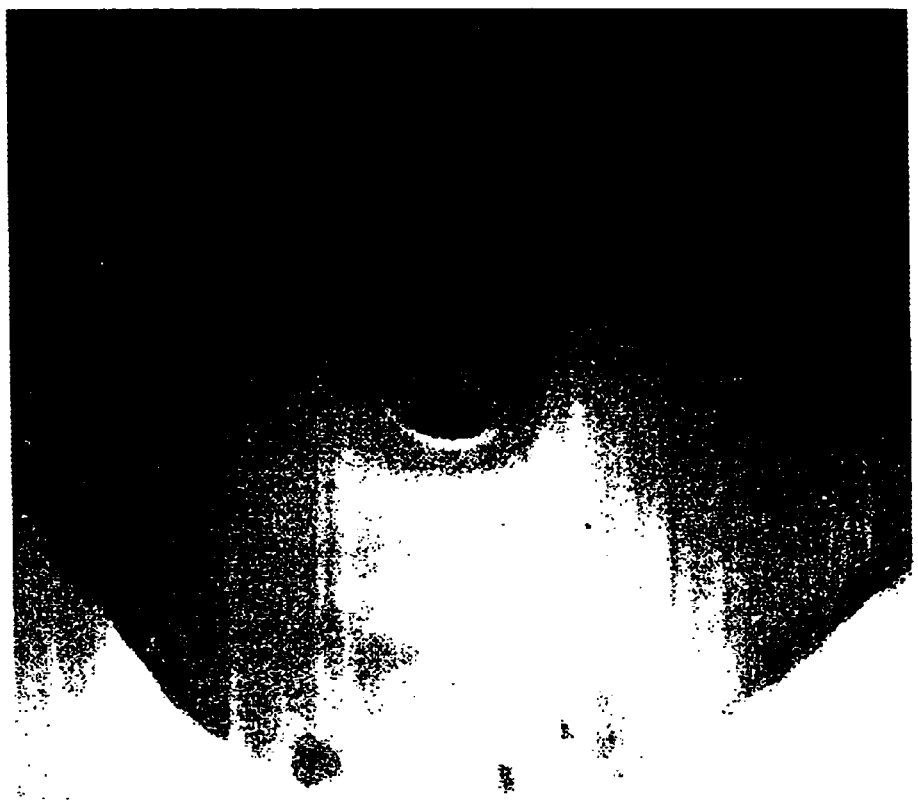
FIG. 18 illustrates a fabricated NiTi membrane actuator in the heated shape.

One embodiment of the present invention is as a microscale actuator for active flow control (AFC). Our device for microscale actuated flow control is to fabricate a NiTi bubble membrane using standard lithographic approaches that will produce out-of plane actuation (FIG. 17). When resistively heated the membrane actuator extends into the flow field and when cooled it flattens out. This actuator exhibits a two-way effect. Although the actuator was designed for possible use in active flow control, the simplicity of the device will allow it to be adapted as an actuation scheme in many other devices, such as micropumps, microvalves, and micro switches. The inventors fabricated a 3 mm diameter NiTi membrane actuator capable of 500 $\mu$m of vertical deflection for use in microscale actuated flow control. The same membrane actuator can be used in microdevices such as micropumps, and microvalves.

Figure 19:
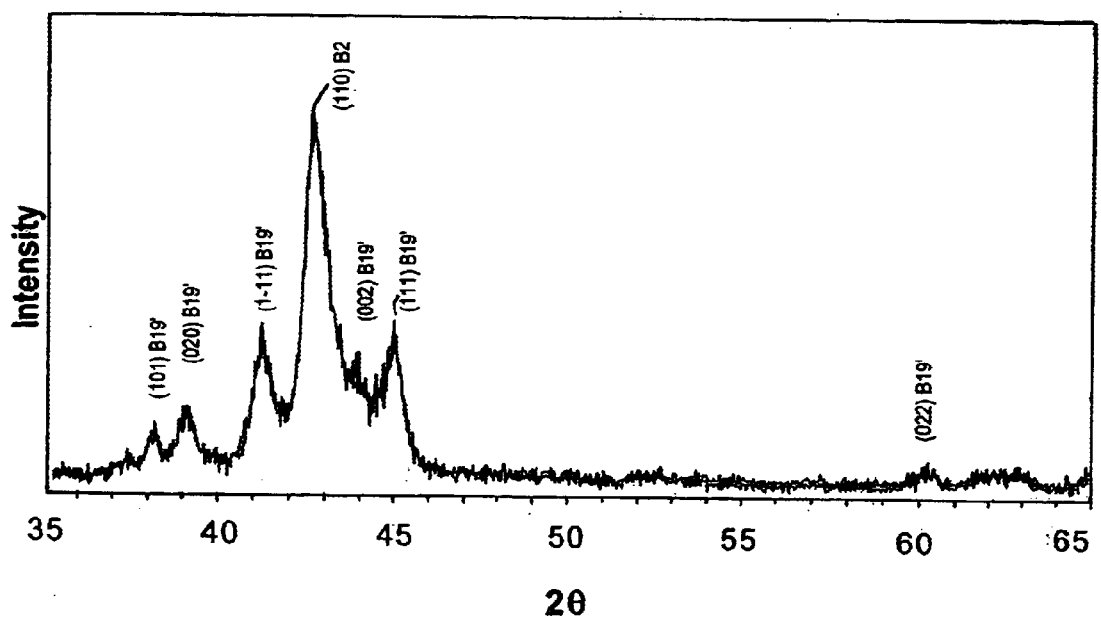
FIG. 19 is a reference of the XRD plot of the target.
Figure 20:
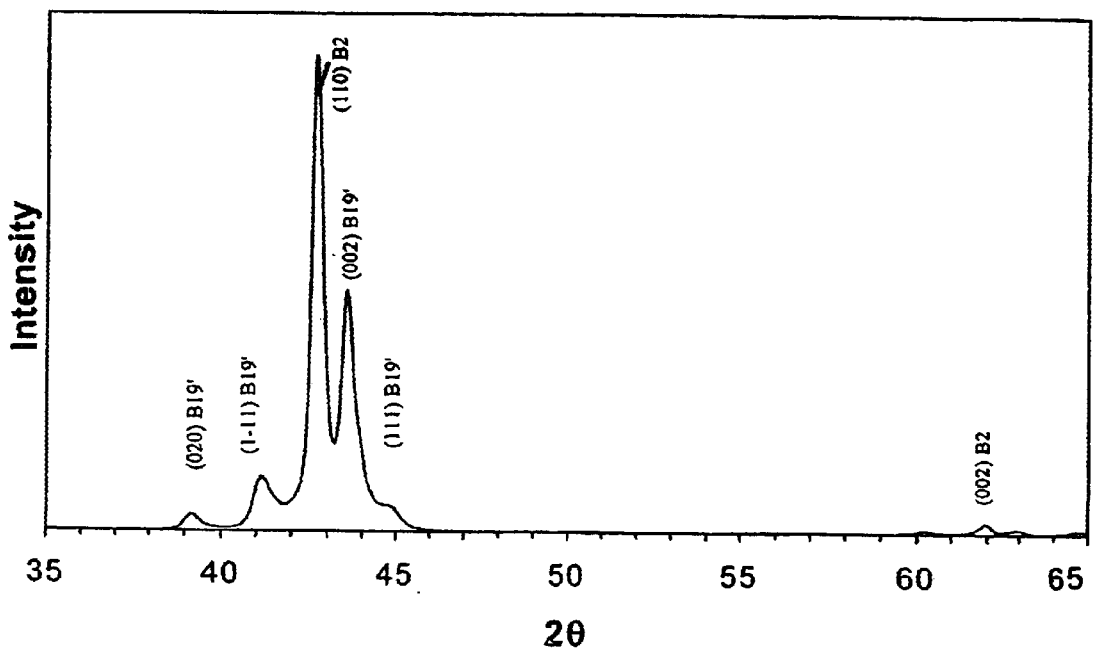
FIG. 20 is an XRD on the T sample illustrating diffraction patterns similar to that of the bulk target with peaks at 2 $\theta$=(39.2 , 41.3 , 43.9 , 44.9), indexed as (020), (1–11), (110), (002), and (111) planes respectively.

XRD (x-ray diffraction) was performed on sputtered films attached to silicon in order to determine the NiTi film's crystalline phase. As a reference the XRD plot of the target is given in FIG. 19. XRD on the T sample (FIG. 20) showed diffraction patterns similar to that of the bulk target with peaks at 2 $\theta$=(39.2°, 41.3°, 43.9°, 44.9°), indexed as (020), (1-11), (110), (002), and (111) planes respectively. This verified that Sample T had the B19' martensitic structure. In addition T films showed peaks at 2 $\theta$=42.9°, 61.9° which is indexed as the (110) and (200) planes of the B2 austenite structure. This suggests that the T films had B2 austenite present.

Figure 21:
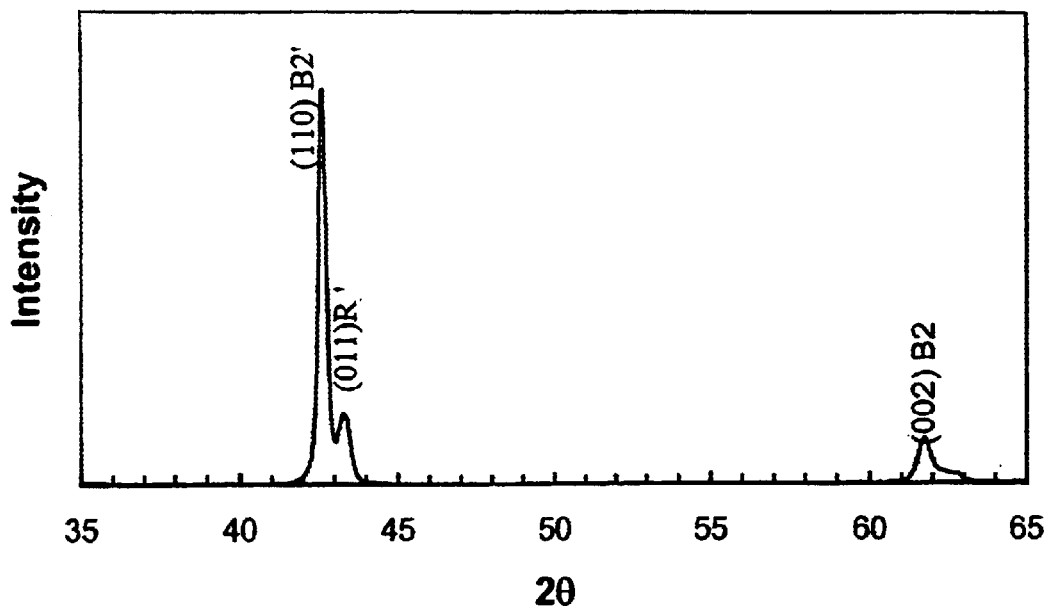
FIG. 21 is an XRD from the H sample indicating that it was martensitic with 2 peaks attributed to the B19' martensitic structure.
Figure 22:
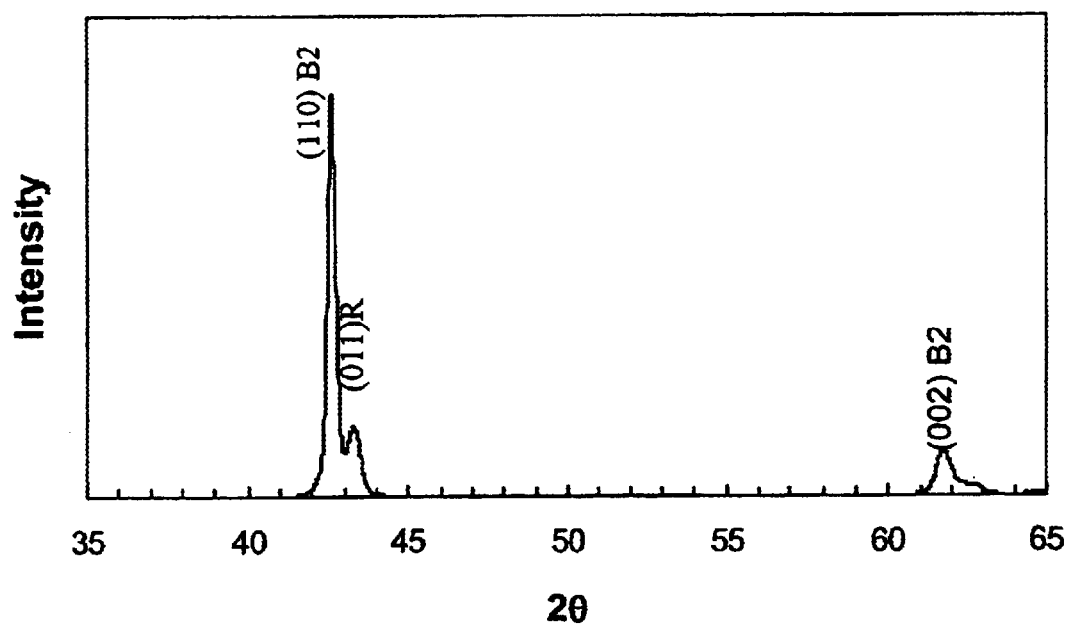
FIG. 22 is an XRD of the C sample showing peaks at 2 $\theta$=(42.8, 43.2, 61.9) which correspond to the B2(110), rombohedral (011), and B2(200) planes.

XRD results from the H films indicated that it was martensitic with 2$\theta$ peaks attributed to the B19' martensitic structure (FIG. 21). In contrast to the T films, the results for the H films did not show any peaks at 2 $\theta$=42.9 and 61.9 indicative of austenite. This indicates that the H films consisted of the B19' phase and that the T samples were multiphase consisting of B2 and B19' phases. The large intensity peaks at 2 $\theta$=60.3° and 64.8° are indexed as the (022) plane of the B19' structure and the silicon substrate respectively. The silicon peak shows up in this specific H film, because the film is thinner than the other samples. XRD of the C films showed peaks at 2 $\theta$=(42.8°, 43.2°, 61.9°) which correspond to the B2(110), rombohedral (011), and B2(200) planes (FIG. 22). This implies that the crystal structure is austenite with some slight straining producing the rombohedral phase.

To determine the influence of substrate heating, samples were deposited on a hot substrate while keeping the target cold. XRD of these samples were given in FIGS. 11 (a–d). The films were deposited on a hot substrate at four different temperatures 200° C., 300° C., 500° C., and 600° C. and subsequently annealed at 500° C. for 10 minutes after deposition to ensure that the films were crystallized. XRD confirm that all films are austenite at room temperatures. At the 500° C. and 600° C. substrate temperatures the R-phase begins to appear. An extra peak in the XRD at 2 $\theta$=37.0° begins showing up in samples produced with 300° C. substrate temperatures and grows with increasing substrate temperatures. This peak is likely due toformation of $Ni_4Ti_3$ precipitates which has a diffraction peak at 37.6° from JCPDS references. Therefore, substrate heating does not produce martensitic films but rather promotes precipitate growth. Precipitates observed in TEM images will be discussed later.

Figure 23:
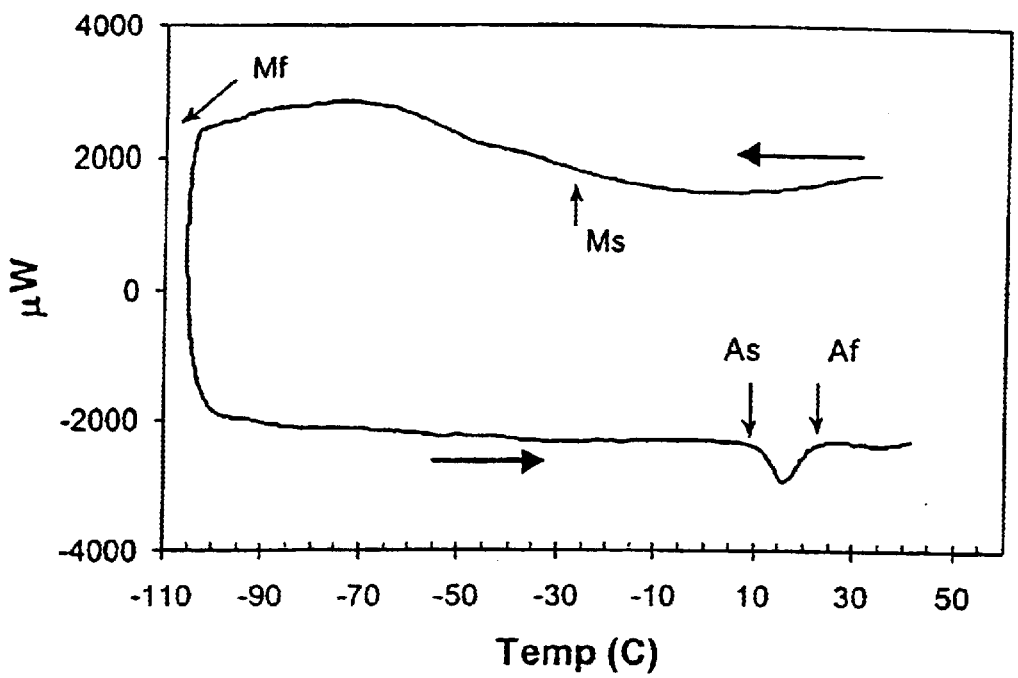
FIG. 23 is a DSC of the film deposited from a cold target (C sample).
Figure 24:
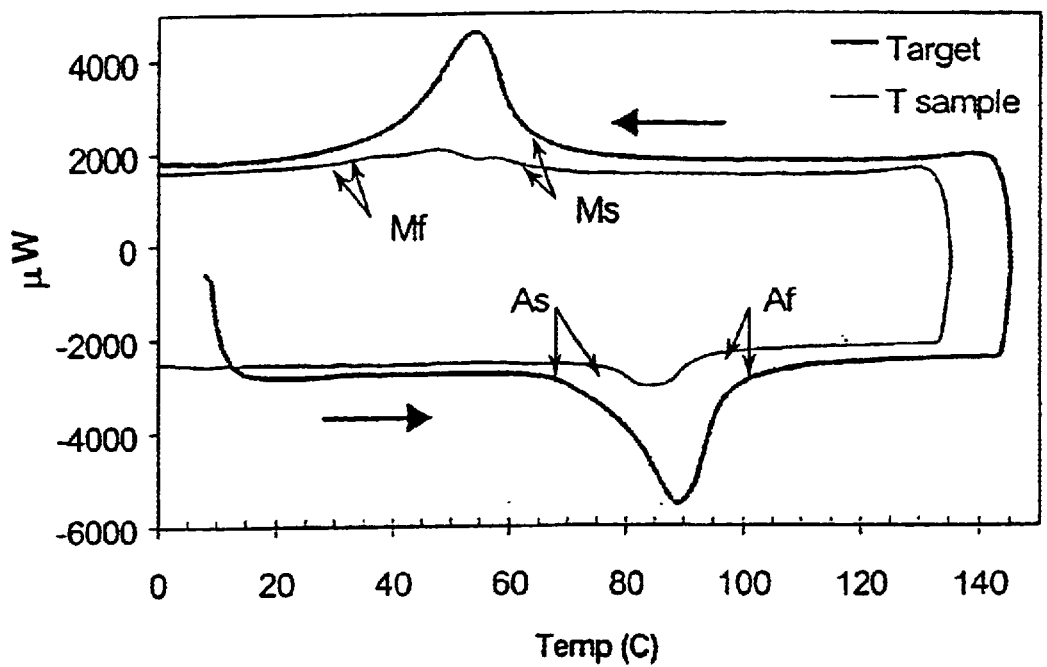
FIG. 24 is a DSC of the film deposited from a hot target (T sample) compared to the DSC of the target.

After verifying the crystal phases of the sputtered films at room temperature, the transformation temperatures of the films and target were measured, first with DSC then with 4 point probe. A DSC result for the C films is given in FIG. 23. DSC results for the T films are shown along with results for the target material (FIG. 24). Table III summarizes the DSC results. Both C and T films show a peak that is broad and short during the exothermic austenite (A) to martensite (M) transformation. This is probably due to the nonuniformity of the films, either through the thickness or radially, such that transformation is occurring over a broader temperature region. The DSC curve of the target material in contrast has transformation points that are more distinct, typical of a material with more uniform phases. Data indicates that T films have transformation temperatures nearly identical to that of the target material. However when reviewing data for the C films a distinct difference is noted. The C film has transformation temperatures 75° C. below the target value. For the C film, the $A_S$ temperature is slightly below room temperature, a property that would be representative of a superelastic material.

Figure 25:
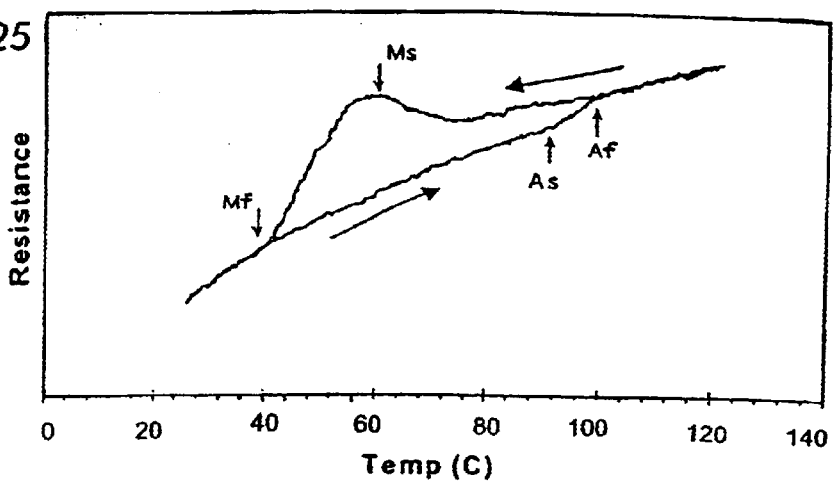
FIG. 25 is 4-point probe measurement of transformation temperature of the target.
Figure 26:
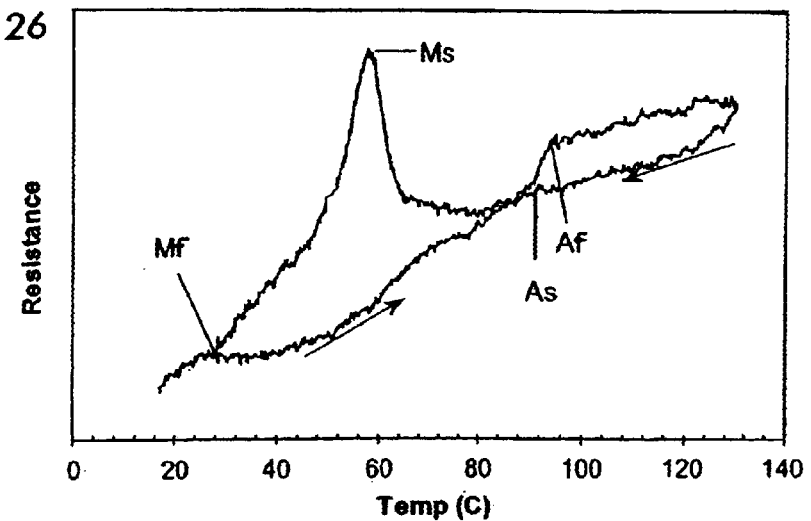
FIG. 26 is a 4-point probe measurement of transformation temperature of the T sample.
Figure 27:
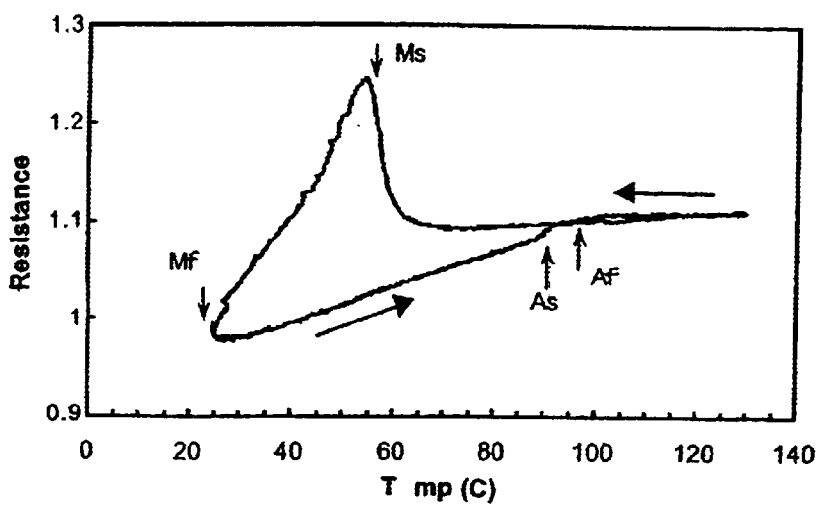
FIG. 27 is a 4-point probe measurement of transformation temperature of the H sample.

Four-point probe resistivity measurement was also used to measure the transformation temperatures. The four point probe method is nondestructive and requires very small material samples. This permits measurement of transformation temperatures at different locations on the wafer to analyze the uniformity of the sputtered film. The transformation temperature was measured at the center of each wafer. The resistance change versus change in temperature from the four-point probe is plotted in FIGS. 25–27 for the target specimen, and the T and H films. The transformation temperatures as measured from 4-point probe are summarized in Table IV. These results are consistent with those obtained from DSC, except for the As values. We do not attribute this difference to measurement errors as the As value was consistently 20° C. above the DSC values. Differences in transformation temperatures measured by different approaches is a phenomena that is common in this material system.

Resisitivity of the bulk target and the film samples were measured with the four point probe at room temperature. The resistivity for a bulk material and a thin film are given by the following equations respectively:

$$\rho = 2\pi s\left(\frac{V}{I}\right) \quad (2)$$

$$\rho = \frac{\pi t}{\ln 2}\left(\frac{V}{I}\right) \quad (3)$$

where V, is voltage, I current, s probe spacing, and t film thickness. The resistivity of the target was found to be 65 μohm-cm at 25° C. Resistivity for the C sample, T sample and H sample at 25° C. were 93, 86, and 75 μohm-cm respectively.

Compositional analysis of the target and sputtered films were done with RBS. Samples were taken from the center of each wafer. RBS is reported to be accurate to within 0.5 atm %. Results are summarized in table V. The composition of the target was 51.8 atm % Ti:Ni, the T sample composition was 50.5 atm % Ti, and the C sample had a composition of 49.2 atm % TI. The H sample had a composition slightly closer to that of the target than the T samole 50.8 atm % Ti. Assuming that temperature influences Ti composition, this would be expected as the H sample was deposited from a target that was always above 450° C. whereas the target temperature was ramped up from 25° C. for the T sample. We believe these results confirm our assumption that heating the target alters the composition of the deposited films. In this case the heated target produced films with composition very near that of the target.

Figure 28:
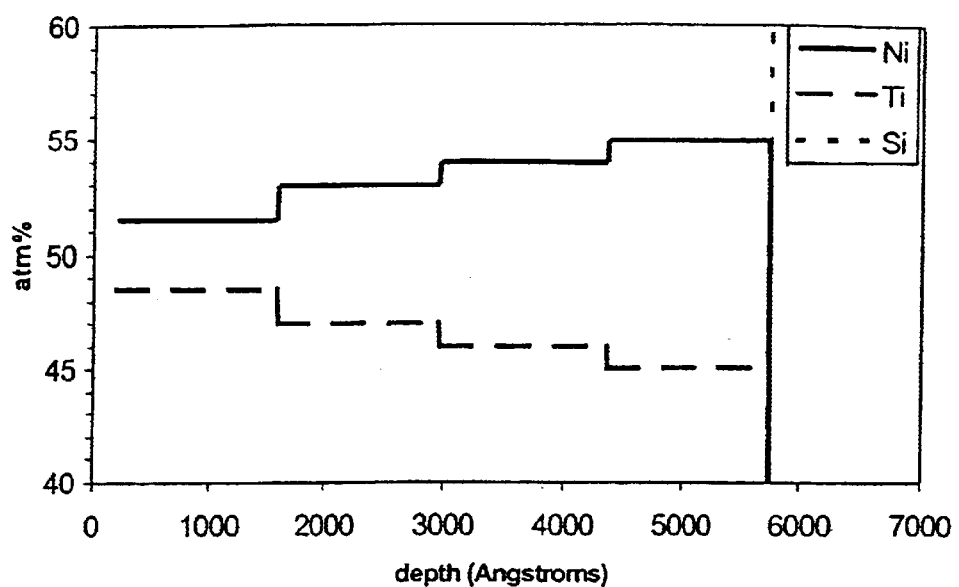
FIG. 28 is a RBS of sputtered film showing the compositional gradation through the thickness of the film.

As mentioned in the experimental setup, T films were sputtered at temperatures transitioning from room temperature up to 700° C. As the target heats up, the film produced should have a compositional gradation through its thickness. RBS can give composition through the thickness of a film if the film is sufficiently thin, such that the RBS signal penetrates through the film and detects the substrate reference (<1 μm). To obtain films thin enough for observing compositional variation through the thickness, the T sample film was divided into thinner sections by sputtering for 4 minutes then rotating the substrate to sputter the remaining 6 minutes on a new location. The initial 4 minutes of sputtering, which corresponds to a maximum temperature of 400° C. were examined. The composition versus depth is given in FIG. 28.

These results show that the Ni content decreases through the thickness corresponding to an increase in target temperature. The initial 0.1 μm thickness at the beginning of the deposition run shows a Ti composition of 45.0 atm % Ti which is a fairly large deviation from the target composition. At the top, the film composition is closer to the composition of the target at 48.5 atm % Ti. This compositional gradation occurs over too large a thickness range 0.6 μm to be attributed to interfacial reactions, which have been shown to be only 10–100 nm in thickness [Q. Su, S. Z. Hua, M. Wuttig: SPIE 2189, 409 (1994)].

Figure 29A:
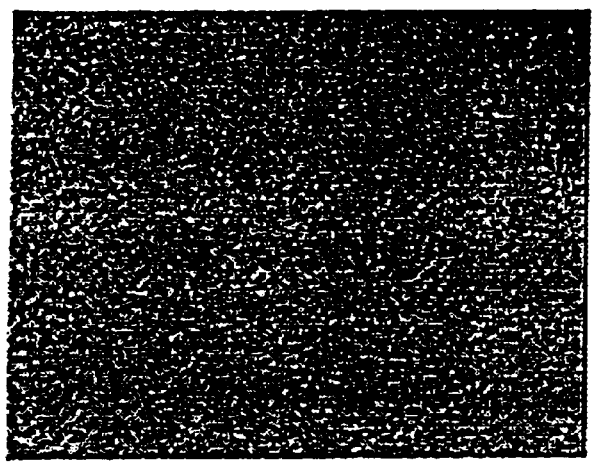
(FIG. 29a), at 60° C.
Figure 29B:
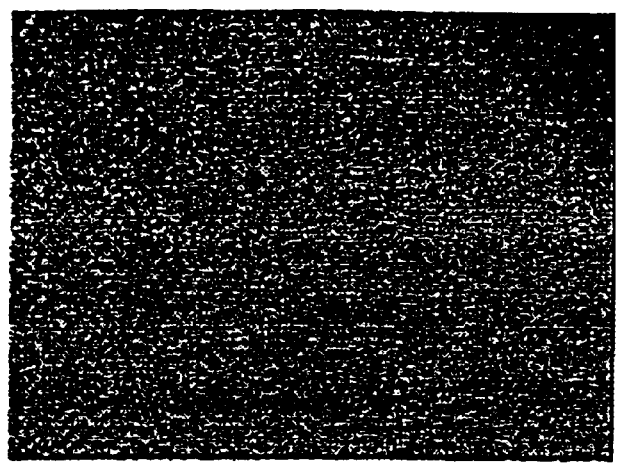
(FIG. 29b) and at 80° C.
Figure 29C:
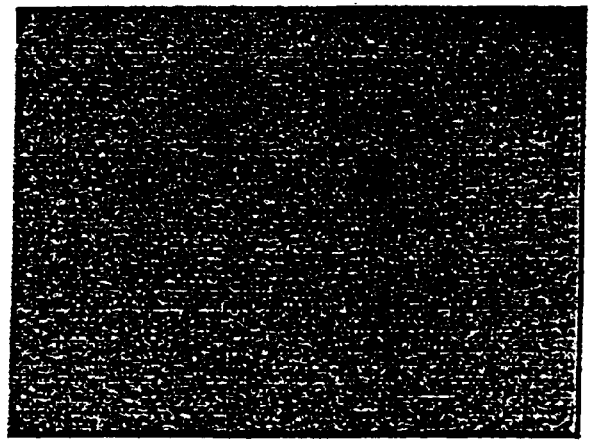
(FIG. 29c).

Optical microscopy was used to observe the film attached to the substrate. After crystallization, the C samples were shiny, indicating a high modulus austenite phase, while T and H samples were cloudy (due to a highly textured surface) when cooled and shiny when heated up, as seen in FIGS. 29(a–c) showing the optical micrographs of martensitic platelets at 25° C. (FIG. 29a), at 60° C. (FIG. 29b) and at 80° C. (FIG. 29c). The surface texture is due to martensitic platelets that develop to accommodate the large residual tensile stresses in the film. Sputtered films typically have tensile residual stresses due to the more compact ordering of the film after crystallization compared to the initial amorphous phase. These martensitic platelets will disappear and reappear, corresponding to the change from austenite to martensite phase. These results confirm that at room temperature the C films are austenite and the T and H films are martensite, at least on the surface.

Figure 30A:
FIGS. 30(a–c) are TEM micrographs of the T samples showing subgrains and a large amount of strain fields (FIG. 30a). Grain sizes were on the order of 1 $\mu$m (FIG. 30b). SADP (selective area diffraction pattern) of the T sample is seen in FIG. 30c.
Figure 30B:
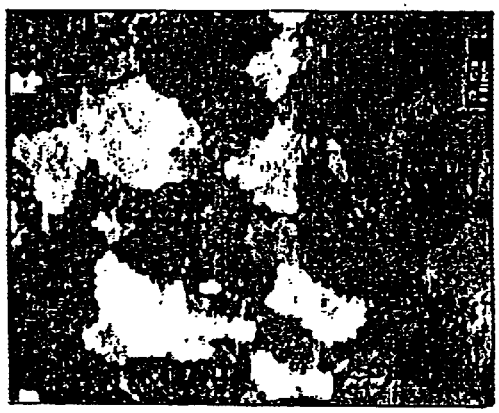
Figure 30C:
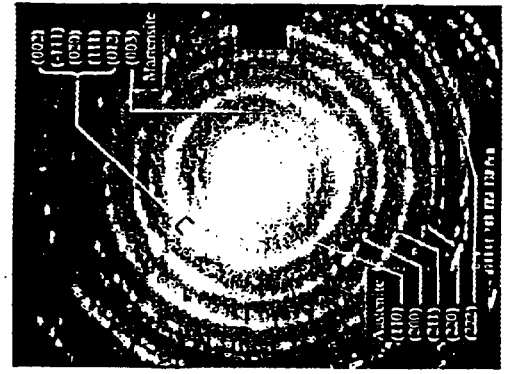

TEM samples were prepared by ion milling with a liquid nitrogen cold stage to prevent heating of the samples. FIGS. 30(a–c) show TEM micrographs of the T samples, showing subgrains and a large amount of strain fields (FIG. 30a). Grain sizes were on the order of 1 μm (FIG. 30b). Higher magnification of individual grains showed the presence of subgrains within the larger grain. This and the straining of the lattice due to the martensitic structure explains why the XRD peaks of martensitic NiTi are so widely spread compared to typical XRD plots of other compounds. Subgrains have crystal planes oriented only a few degrees off from the other grains. A large number of these subgrains would spread the diffraction peaks over a wider angle in diffraction plots. The large amount of contrast within the grains indicate large amounts of strain fields due to either crystal defects or possible precipitates. These defects could have been introduced during the ion milling process. Twinning planes indicative of the martensitic phase was not observable. SADP (selective area diffraction pattern) of the T sample was inconclusive in determining the presence of the martensitic phase because the diffraction rings due to the (002), (−111), (020), (111), and (012) planes of the monoclinic martensite phase were closely located within the highest intensity ring (FIG. 30c). However, the remaining rings were indexed as the B2 austenite structure. This implies that the film is multiphase. The presence of a multiphase across the area probably occurred after the ion milling.

Figure 31A:
FIGS. 31 (a–b) are TEM images of the C samples. Grains sizes were found to be on the order of 0.5 $\mu$m (FIG. 31a). SADP of the sample in FIG. 31b can be indexed as the austenite B2 cubic structure.
Figure 31B:
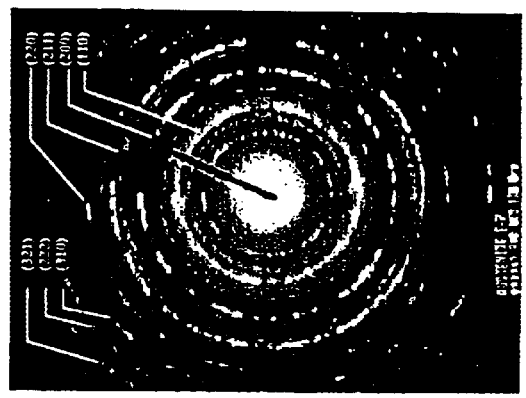
Figure 32A:
FIGS. 32(a–d) are TEM images on the heated substrate which confirms the presence of precipitates. Grain sizes were similar to the previous samples varying from 0.2 $\mu$m to 1 $\mu$m in size (FIG. 32a). The grains displayed very small strain fields; strain fields were much more predominant in the previous C and T samples. The small strain fields resulted, most likely, because the substrate heating had the effect of annealing the film. Therefore, residual stresses can be removed using substrate heating.
FIG. 32b shows the presence of intergranular precipitates. The precipitates were measured to be about 20 nm in diameter (FIG. 32c). SADP indicated again the presence of the B2 austenite phase (FIG. 32d).
Figure 32B:
Figure 32C:
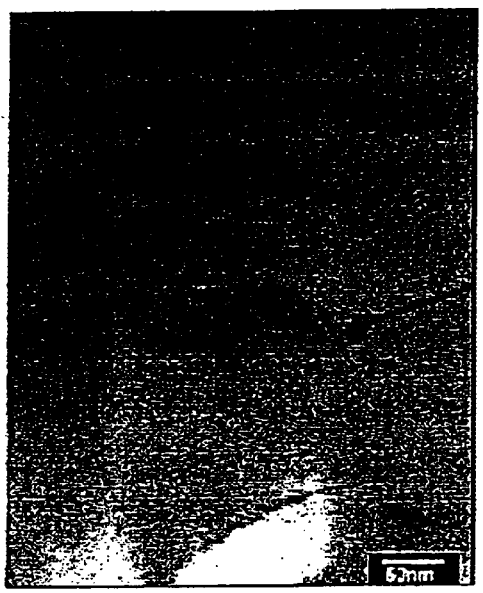
Figure 32D:
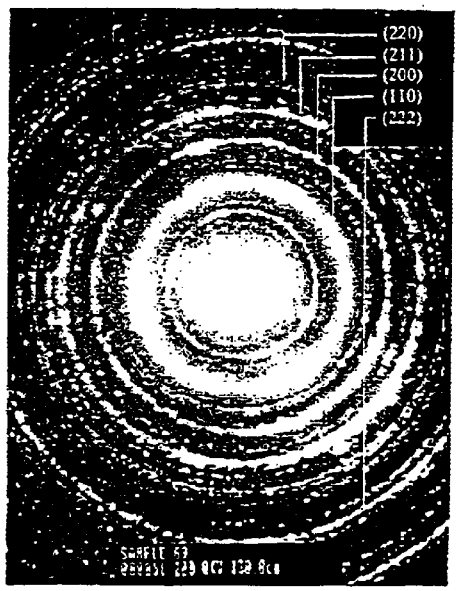

FIGS. 31 (a–b) are TEM micrographs of the C film. Grains sizes were found to be on the order of 0.5 μm (FIG. 31a). The large contrast again indicates grains under large amounts of strain fields. SADP of the sample in FIG. 31b can be indexed as the austenite B2 cubic structure. The additional lower intensity diffraction rings could be due to oxides in the film.

TEM studies were done on the 600° C. substrate heated sample to confirm the presence of precipitates (FIGS. 32(a–d)). FIGS. 32b shows the presence of intergranular precipitates. The precipitates were measured to be 20 nm in size (FIG. 32c). Grain sizes were similar to the previous samples varying from 0.2 μm to 1 μm in size (FIG. 32a). The grains showed very little strain fields that was so predominant in the previous C and T samples. This is most likely due to the annealing effect of substrate heating. This suggest that the high residual stresses can be removed using substrate heating. SADP indicated again the presence of the B2 austenite phase (FIG. 29d). The numerous extra diffraction rings could not be indexed because of the large amount of possible oxides and precipitates that could have contributed to them.

Without limiting the invention, the authors believe that the difference in film properties is due to target heating. A possible explanation for this phenomena follows. In sputtering the near equiatomic NiTi target, Ti has a higher sputtering yield. However, since conservation of mass demands that the flux of Ni and Ti from the target will be essentially equal, this causes an altered layer to exist on the target, about 800 Å thick, richer in Ni. The precise composition is such that is both the difference in sputtering yield and an equal atomic flux of Ni and Ti are accommodated. However, even though the flux of Ni and Ti atoms from target is the same, films deposited by sputtering typically do not have the same composition as the target. This difference in film composition can be attributed to two factors: a difference in angular distribution of the sputtered species, and the sticking coefficient. It has been shown that the polar angular distribution of Ti is wider than that of Ni during sputtering [V. S. Chernysh, V. S. Tuboltsev, V. S. Kulikauskas: Nuclear Instr. And Methods in Physics Research B 140, 303 (1998) and I. Neshev, R. G. Vichev, S. Tzanev, S. S. Todorov: Vacuum 44, no3–4, 209 (1993)]. This means that the Ti:Ni ratio is larger at low angles from the target surface plane and is smaller at 90° from the surface plane. Also, this difference in angular distribution will be more pronounced the further the substrate is from the target. We believe that the angular distribution is caused by the altered top layer of the target.

By heating the target to high temperatures, the binding energy decreases thereby changing the sputtering yields of Ni and Ti. This changes the composition of the altered layer. Diffusion also becomes a factor at high temperatures and also influences the composition of the altered layer. The altered layer is then changed by heating the target such that the difference in angular distribution of Ni and Ti becomes less pronounced resulting in a film composition closer to that of the target.

Sputter deposition of NiTi films exhibiting the SME above 25° C. is difficult because of the sensitivity of the shape memory characteristics to composition. As a consequence sputter deposition from a single near equiatomic NiTi target typically requires compensation with titanium plates. In this paper we have shown that by heating the target to over 400° C. during deposition, we can limit the loss of Ti and produce films exhibiting the SME above 25° C. Controlling the target temperature can also be used to produce films with the two-way SME. This novel method of fabricating NiTi films exhibiting the two way effect can be improved with better process control, such that a precise 2D austenite martensite bimorph structure can be tailored as desired.

Narrowing the compositional difference between the deposited film and the target by heating the target has tremendous implication in other fields of sputtering. For example in deposition of magnetic alloys for the hard drive industry a more uniform angular distribution of its constituents would result in a more compositionally uniform film that is closer in composition to that of the target. This would allow for much smaller magnetic domains thereby increasing the amount of data storage per unit area.

A. Peter Jardine, "Deposition parameters for sputter-deposited thin film TiNi", Mat Res. Soc. Symp. Proc., Vol 360, 1995, discloses practical limitations imposed by a vacuum system for the relationship between base vacuum pressure and target-sample distance, which affects the phases in sputter deposited Ti—Ni thin films.

For a $P_r$ value of 0.01, representing the lower limit, at a distance of 6.0 cm the base pressure was $5 \times 10^{-7}$ torr. Using a more reasonable value of P=0.001, corresponding to a stoichiometric deviation of 0.1 at %, a minimum pressure of $8 \times 10^{-8}$ torr is required. These values are in agreement with the observations of many workers that a pressure of $10^{-7}$ torr was needed to obtain stoichiometric TiNi. At larger distances of 15.2 cm (6 in), the requisite base pressure was approximately $2 \times 10^{-8}$ torr for P=0.01 and $2 \times 10^{-9}$ torr for P=0.001.

X-ray diffraction profiles distance of 8.0 cm shows two peaks, corresponding to the TiNi's B2 peak at (2.12 Å) and a peak at (2.09 Å) possibly the B19 peak.

At 10 cm to 20 cm, the B2 peak is observed, indicating low martensitic transformation temperatures. At 25 cm, B2 peak is difficult to identify and had additional peaks corresponding to the likely formation of oxides and nitrides on the surface.

For successful deposition of TiNi at a distance of 10 cm (4 in), the maximum base pressures that can be tolerated are of the order of $10^{-9}$ torr. The extreme composition dependence of the SME properties of TiNi suggests that sputtering distances and base pressures are important to ensure that the resultant transformations will be uniformly similar for TiNi devices made from a wafer, regardless of the position of the material on the substrate.

Miyazaki and K. Nomura. "Development of perfect shape memory effect in sputter-deposited Ti—Ni thin films", Proceedings IEEE Microelectro Mechanical Sys., p. 176, 1994 discloses that shape recovery stress and shape recovery strain were large enough for fabricating microactuators to power micromachines.

The shape recovery stress was more than 400 MPa. The maximum shape recovery strain amounted to 3%. The maximum recovery stress amounted to as much as 600 MPa.

R. H. Wolf and A. H. Heuer, "TiNi (Shape Memory) Films on Silicon for MEMS Applications". J. of Microelectromechanical Sys., vol.4, no.4, p.206, 1995 discloses a method for fabricating a TiNi diaphragm from a TiNi shape memory alloy in thin film form that is an excellent candidate for a MEMS micro-actuator.

The diaphragms recovered greater than 2% strain when heated through the phase transformation temperature, providing a work density of at least $5 \times 10^6$ J/m$^3$. This work density is higher than that of any other type of microactuator.

Figure 1:
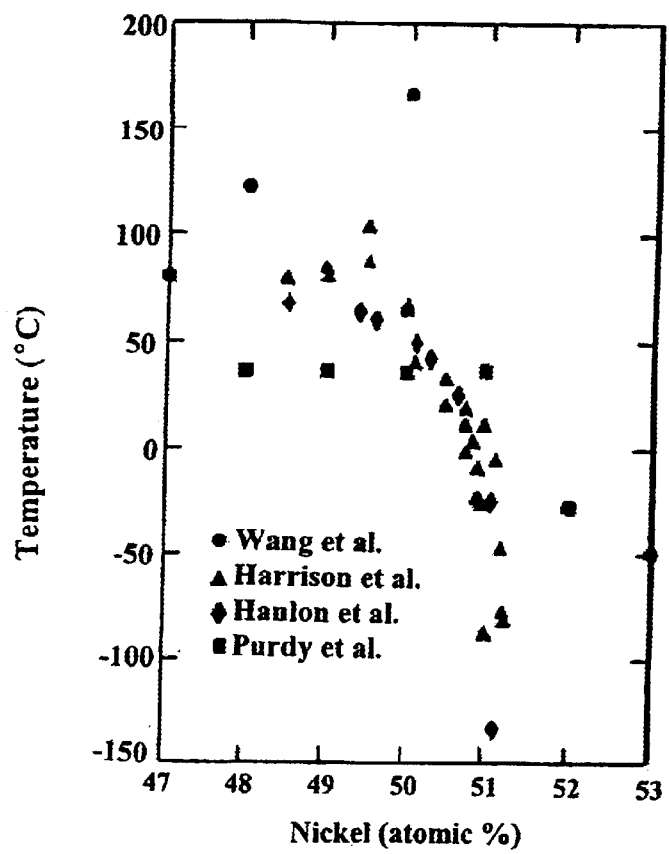
FIG. 1 is a graph showing the compositional sensitivity of NiTi transformation temperature and the dependence of transformation temperature on Ni:Ti stoichiometry.
Figure 2:
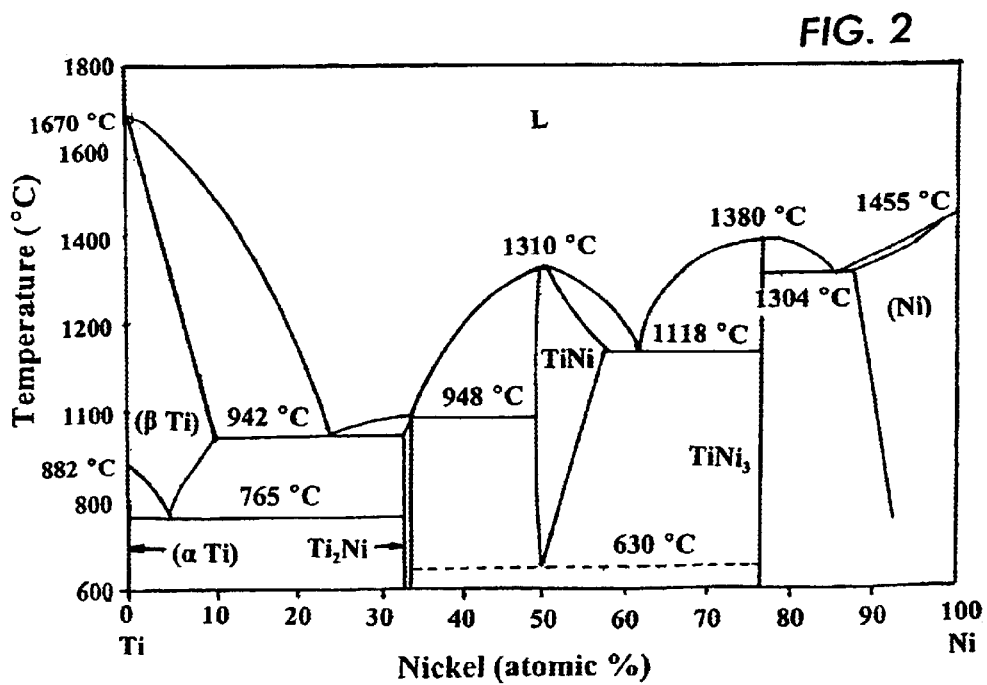
FIG. 2 is a graph showing the NiTi phases.

For the fabrication of TiNi diaphragms, substrate micromachining was done prior to deposition, in order to minimize the exposure of the TiNi to hot ethylene diamine pyrocatechol (EDP) etchant. Wafers with a thermal oxide on both sides were coated with photoresist and "soft baked." The photoresist was then patterned on the back side to open EDP etch windows in the oxide. This pattern contained 2 mm×2 mm square diaphragms and division lines separating the wafer into individual 10 mm×10 mm diaphragm sections. EDP was then used to etch a majority of the diaphragm cavities, as well as the division lines. The oxide was removed from the front side of the wafer just prior to deposition using a buffered oxide etchant. After the TiNi was deposited and annealed, the remainder of the silicondiaphragm support was removed using EDP, thus releasing a suspended diaphragm of TiNi (FIG. 1).

P. Krulevitch, A. P. Lee, P. B. Ramsey, et. al., "Thin film shape memory alloy microactuators", J. of Microelectromechanical Sys., vol.5, no.4, 1996 discloses micromachining and design issues for SMA micro-actuators.

TiNi Alloy Co. built a membrane-based gas microvalve that survived more than two million cycles, and along with Microflow Analytical Inc., they have made microvalves with SMA ligaments serving as the actuator. Nickel-titanium-copper SMA's with 50 at. % Ti and 5–15 at. % Cu, are less sensitive to composition than binary Ni—Ti, making Ni—Ti—Cu films a more forgiving material for thin film deposition. Typical sputtering pressures range from 0.1 to 0.93 Pa.

A bimorph-type SMA diaphragm deflects downwards upon heating, pulling away from the glass cover layer and opening the valve. After etching the flow channels on the front side, the diaphragm region was etched from behind using the anisotropic silicon etchant ethylene diamine pyrocatechol (EDP), forming a 2.0 $\mu$m boron-doped silicon diaphragm. A 1.5-$\mu$m thick Ni—Ti—Cu film was then deposited onto the back side of the diaphragm. Next, a 100-nm gold film with a 5-nm titanium adhesion layer was evaporated over the silicon diaphragm region to prevent adhesion of the diaphragm to the glass during the low temperature (300° C.) anodic bonding step. Exposure to nitrogen for approximately two hours at 300° C. during the bonding caused the surface of the Ni—Ti—Cu film to nitridize, giving the originally silver colored film a golden hue, and reduced the recoverable stress from 340 to 308 MPa.

Figure 33A:
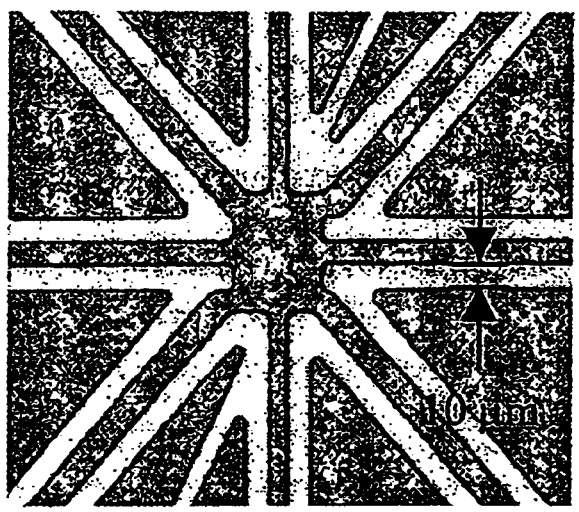
FIGS. 33 (a,b) show (a) an originally planar TiNi Foil Element, and (b) a heated TiNi Foil Element that deforms into a cage to envelope a volume.
Figure 33B:
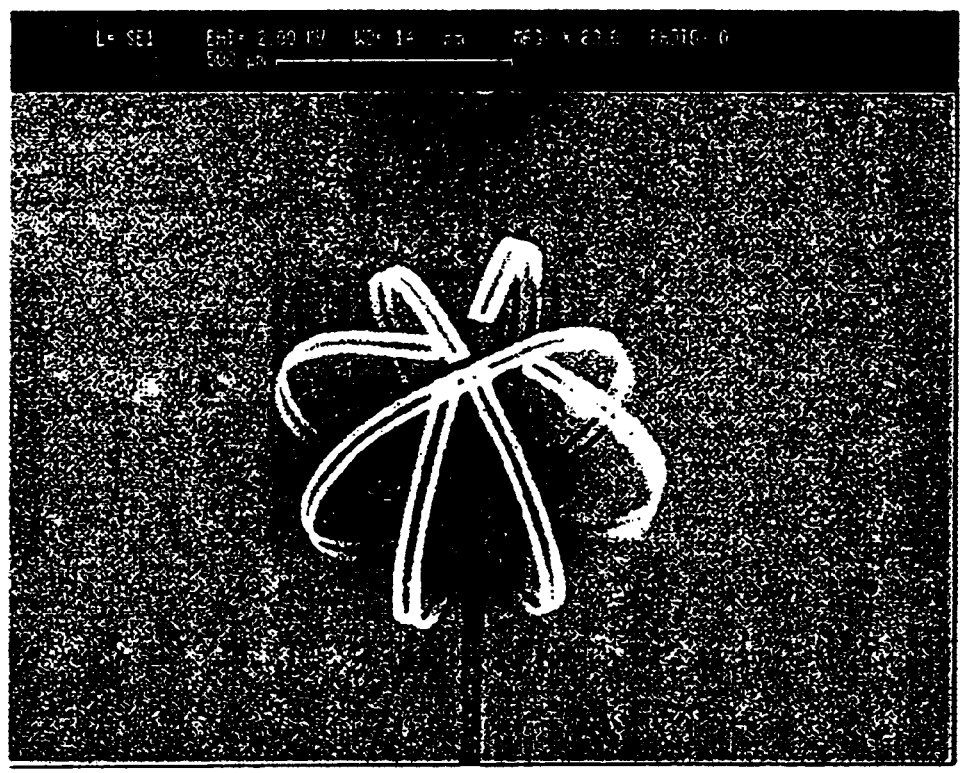

FIG. 33 shows a shape memory effect device comprising a thin film foil elements. The elements were produced by increasing the temperature of the target during sputter deposition onto a substrate. The elements have a compositional gradation, having one surface of the film with a martensitic phase at room temperature, while the other surface is an austenitic phase. Upon heating above the transition temperature, which is above-room temperature, the martensite changes phase to austenite, resulting in the curling of the elements into the shape of a spherical cage. Upon cooling to room temperature, the martensitic phase returns, and the elements return to a planar configuration.

Although the foregoing invention has been described in some detail by way of illustration and example for purposes of clarity and understanding, it will be obvious that various modifications and changes which are within the knowledge of those skilled in the art are considered to fall within the scope of disclosed invention.

TABLE I mean free path at varying pressures

| Pressure (Tor) | Mean free path (cm) |
|---|---|
| 1 × 10-6 | 0.07 |
| 1 × 10-7 | 0.7 |
| 5 × 10-8 | 1.4 |
| 1 × 10-8 | 7.0 |
| 1 × 10-9 | 70 |

TABLE II

| Time (min) | Temp (° C.) |
|---|---|
| 0 | 30 |
| 5 | 310 |
| 10 | 540 |
| 15 | 650 |

TABLE II

DSC Results

| Sample | As | Af | Ms | Mf |
|---|---|---|---|---|
| Target (from manufacturer) | 95° C. | 110° C. | 68° C. | 55° C. |
| H sample (Hot target) | 80° C. | 105° C. | 60° C. | 20° C. |
| C sample (Cold target) | −7° C. | 22° C. | 100° C. | 150° C. |

TABLE III

DSC Results

| Sample | As | Af | Ms | Mf |
|---|---|---|---|---|
| Target (from manufacturer) | 70° C. | 100° C. | 65° C. | 35° C. |
| T sample (Heated target) | 75° C. | 95° C. | 60° C. | 30° C. |
| C sample (Cold target) | 10° C. | 25° C. | −25° C. | <−100° C. |

TABLE IV 4-point probe Results

| Sample | As | Af | Ms | Mf |
|---|---|---|---|---|
| Target (from manufacturer) | 90° C. | 100° C. | 60° C. | 40° C. |
| T sample (Heated target) | 95° C. | 95° C. | 55° C. | 25° C. |
| H sample (Cold target) | 90° C. | 95° C. | 55° C. | 25° C. |

TABLE V

RBS results

| Sample | Ni atm % | Ti atm % | Ni/Ti ratio |
|---|---|---|---|
| C sample | 50.8 | 49.2 | 1.03 |
| T sample | 49.5 | 50.5 | 0.98 |
| H sample | 49.2 | 50.8 | 0.969 |
| Target | 48.2 | 51.8 | 0.931 |

What is claimed is:

1. A sputter deposition process for fabricating a shape memory alloy thin film, comprising:
    inserting a target comprised of nickel and titanium and a substrate in an ultra high vacuum, sputter deposition chamber;
    drawing an ultra high vacuum in the system, wherein the partial pressures of reactive vapors are less than a maximum pressure, wherein the maximum pressure is determined by the pressure at which the reaction between the reactive vapors and one or more of the constituent elements is negligible;
    controlling the initial temperature of the target;
    exposing the substrate;
    depositing material from the target to the substrate, wherein the temperature of the target is changed over time during deposition of the shape memory alloy thin film.

2. The sputter-deposition process of claim 1, wherein the target comprises about 50 atomic percent nickel and about 50 atomic percent titanium, and the temperature of the target is gradually increased over time during deposition of the shape memory alloy thin film.

3. The sputter deposition process of claim 1, wherein the target comprises about 50 atomic percent nickel and about 50 atomic percent titanium, and the temperature of the target is gradually decreased over time during deposition of the shape memory alloy thin film.

4. The sputter deposition process of claim 1, wherein the target further comprises at least one element in addition to nickel and titanium.

5. The sputter deposition process of claim 1, wherein the thin film is deposited with a single sputtering gun.

6. The sputter deposition process of claim 1, wherein the distance between the target and the substrate is less than 10 cm.

7. The sputter deposition process of claim 6, wherein the distance between the target and the substrate is in a range from 3 cm to 4 cm.

8. A sputter-deposited, thin film shape memory effect device comprising:
    a SME thin film comprised of nickel and titanium, wherein the thin film is sputter-deposited and the thin film has a compositional gradation through at least a portion of the thickness of the thin film, and the compositional gradation is selected such that a phase change occurs above room temperature, wherein the phase change is capable of activating a two-way shape memory effect.

9. A microscale actuator for active flow control, comprising:

a SME thin film comprised of nickel and titanium, wherein the thin film is sputter-deposited, and the thin film comprises a bubble membrane, and the thin film has a compositional gradation through at least a portion of the thickness of the thin film, and the compositional gradation is selected such that a phase change occurs above room temperature, wherein the phase change is capable of activating a two-way shape memory effect in the bubble membrane.

10. A micro scale actuator of claim 9, wherein the bubble membrane extends when heated and flattens when cooled.

11. A microscale actuator comprising:

a SME thin film comprised of nickel and titanium, wherein the thin film is sputter-deposited, wherein the thin film comprises at least one linear element, and wherein the thin film has a compositional gradation through at least a portion of the thickness of the thin film, and wherein the compositional gradation is selected such that a phase change occurs above room temperature, wherein the phase change is capable of activating a two-way shape memory effect in the at least one a linear element.

12. A sputter deposition process for fabricating a thin film shape memory effect device, comprising:

inserting a Ni:Ti target and a substrate in an ultra high vacuum, sputter deposition chamber;

drawing an ultra high vacuum in the system, wherein the partial pressures of water, carbon dioxide and carbon monoxide are less than about $10^{-8}$ Torr;

controlling the temperature of the target;

exposing the substrate;

depositing material from the Ni:Ti target to the substrate, wherein the temperature of the target is gradually increased over time.

13. A sputter-deposited, thin film shape memory effect device, comprising a thin film of NiTi material, wherein the thin film of NiTi material is sputter deposited and wherein the thin film of NiTi has a compositional gradation through the thickness of the film, and wherein the compositional gradation is selected such that a phase change occurs above room temperature that activates a two-way shape memory effect.

* * * * *